(12) United States Patent
Harrington, III et al.

(10) Patent No.: US 9,806,186 B2
(45) Date of Patent: Oct. 31, 2017

(54) TERMINATION REGION ARCHITECTURE FOR VERTICAL POWER TRANSISTORS

(71) Applicant: D3 Semiconductor LLC, Addison, TX (US)

(72) Inventors: Thomas E. Harrington, III, Carrollton, TX (US); John V. Spohnheimer, Carrollton, TX (US); Zhijun Qu, Frisco, TX (US)

(73) Assignee: D3 Semiconductor LLC, Addison, TX (US)

( * ) Notice: Subject to any disclaimer, the term of this patent is extended or adjusted under 35 U.S.C. 154(b) by 35 days.

(21) Appl. No.: 14/873,831

(22) Filed: Oct. 2, 2015

(65) Prior Publication Data

US 2017/0098705 A1    Apr. 6, 2017

(51) Int. Cl.
*H01L 29/78* (2006.01)
*H01L 29/40* (2006.01)
*H01L 29/06* (2006.01)
*H01L 29/739* (2006.01)

(52) U.S. Cl.
CPC ...... *H01L 29/7811* (2013.01); *H01L 29/0619* (2013.01); *H01L 29/0634* (2013.01); *H01L 29/0696* (2013.01); *H01L 29/404* (2013.01); *H01L 29/7395* (2013.01)

(58) Field of Classification Search
CPC ............. H01L 29/7811; H01L 29/0623; H01L 29/0634; H01L 29/402; H01L 29/407; H01L 29/4238; H01L 29/0661; H01L 29/7802; H01L 29/404; H01L 29/7395; H01L 29/0692; H01L 29/66712
See application file for complete search history.

(56) References Cited

U.S. PATENT DOCUMENTS

| 3,909,119 A | 9/1975 | Wolley |
| 5,877,529 A | 3/1999 | So et al. |
| 7,586,161 B2 * | 9/2009 | Pfirsch ............... H01L 29/0615 257/378 |
| 7,638,841 B2 | 12/2009 | Challa |

(Continued)

OTHER PUBLICATIONS

International Search Report and Written Opinion of the ISA (RO/US) in PCT/US2016/53934, mailed Feb. 8, 2017.

*Primary Examiner* — Bac Au
(74) *Attorney, Agent, or Firm* — Carrington, Coleman, Sloman & Blumenthal, L.L.P.

(57) ABSTRACT

A vertical power switching device, such as a vertical superjunction metal-oxide-semiconductor field-effect-transistor (MOSFET), in which termination structures in the corners of the integrated circuit are stretched to efficiently shape the lateral electric field. Termination structures in the device include such features as doped regions, field plates, insulator films, and high-voltage conductive regions and elements at the applied substrate voltage. Edges of these termination structures are shaped and placed according to a $2^{nd}$-order smooth, non-circular analytic function so as to extend deeper into the die corner from the core region of the device than a constant-distance path. Also disclosed are electrically floating guard rings in the termination region, to inhibit triggering of parasitic p-n-p-n structures.

26 Claims, 17 Drawing Sheets

(56) References Cited

U.S. PATENT DOCUMENTS

| | | | |
|---|---|---|---|
| 7,800,175 B2* | 9/2010 | Ono | H01L 29/0619 |
| | | | 257/329 |
| 7,919,824 B2* | 4/2011 | Ono | H01L 29/0634 |
| | | | 257/367 |
| 7,923,804 B2 | 4/2011 | Zeng et al. | |
| 8,487,372 B1 | 7/2013 | Hsieh | |
| 8,673,700 B2 | 3/2014 | Yedinak et al. | |
| 8,680,613 B2 | 3/2014 | Guan et al. | |
| 8,803,277 B2 | 8/2014 | Henning et al. | |
| 9,117,899 B2 | 8/2015 | Harrington, III | |
| 9,129,819 B2* | 9/2015 | Abe | H01L 29/404 |
| 9,337,257 B2* | 5/2016 | Nakano | H01L 29/41741 |
| 2005/0145933 A1 | 7/2005 | Onishi et al. | |
| 2012/0273871 A1 | 11/2012 | Yedinak et al. | |
| 2013/0020635 A1 | 1/2013 | Yilmaz et al. | |
| 2014/0027819 A1 | 1/2014 | Guan et al. | |
| 2014/0097491 A1 | 4/2014 | Bulucea | |
| 2014/0159192 A1* | 6/2014 | Kakefu | H01L 29/0619 |
| | | | 257/494 |
| 2014/0264343 A1 | 9/2014 | Harrington, III | |
| 2014/0374871 A1* | 12/2014 | Hirabayashi | H01L 29/404 |
| | | | 257/488 |

* cited by examiner

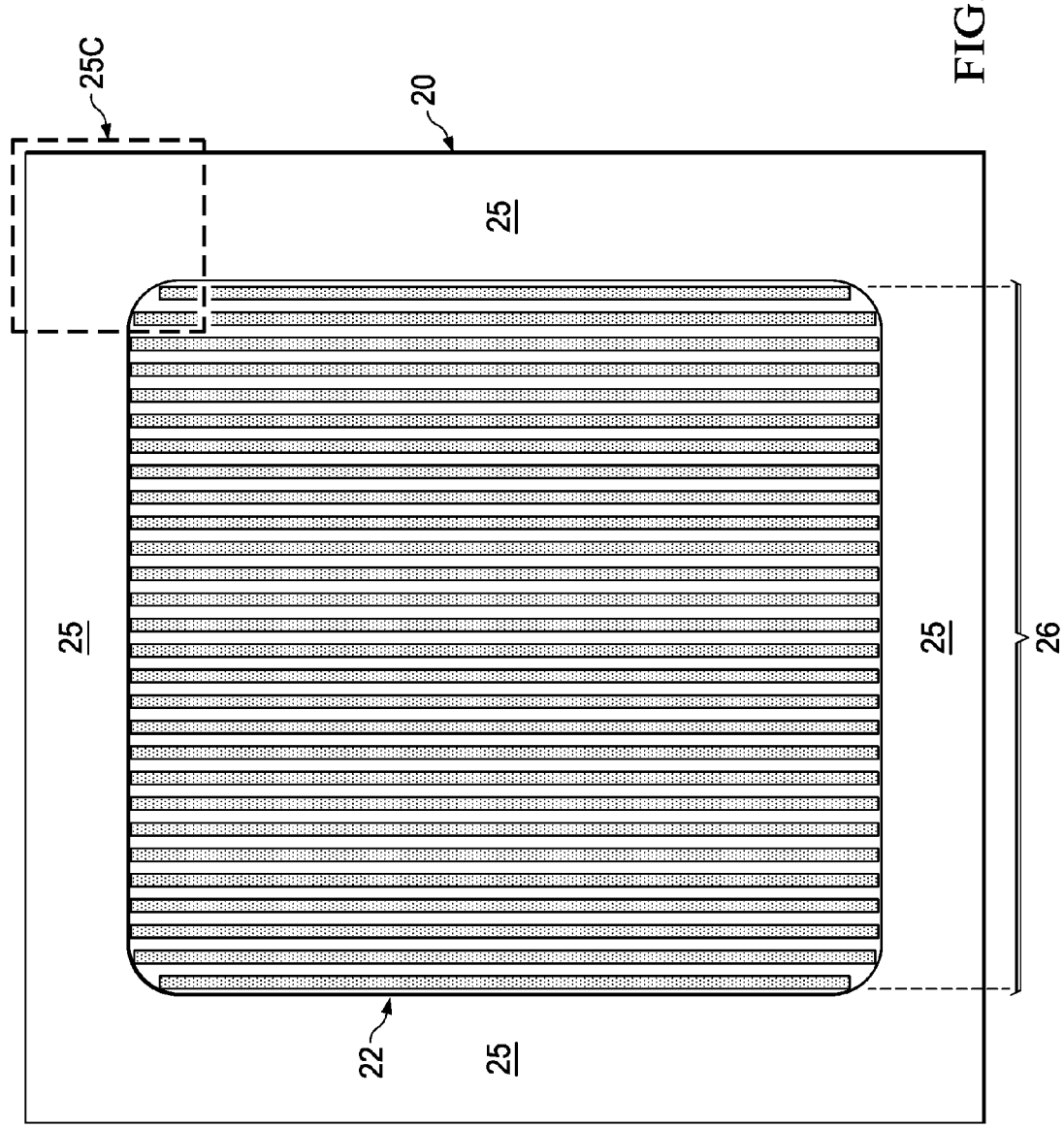

TERMINATION REGION ARCHITECTURE FOR VERTICAL POWER TRANSISTORS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of semiconductor power devices. Disclosed embodiments are directed to termination regions for vertical power transistors, including metal-oxide-semiconductor superjunction transistors.

As known in the art, semiconductor power switching devices are ideally capable of blocking large forward and reverse voltages with minimal current conduction when in the "off" state while conducting large currents with minimal voltage drop when in the "on" state, with minimal switching times and minimal switching power consumption. Improvements in manufacturing yield and reduction in manufacturing cost are also sought. Advances toward these ideal attributes have largely been made in modern power transistors through innovations in device architecture, rather than through shrinking of device features sizes as in the case of low-power semiconductor devices such as digital logic and memory devices.

In this regard, vertical power devices are now widely used in many power applications. These devices are vertical in the sense that current is conducted vertically, through a drift region between the device surface and its substrate. The length of this drift region can absorb a large depletion region in the off-state and thus establish a high reverse breakdown voltage, which enables high voltage operation. Well-known types of vertical power devices include vertical drift metal-oxide-semiconductor (VDMOS) field-effect transistors, insulated gate bipolar transistors (IGBTs), and vertical power diodes, all of which include a drift region sufficient to support the desired high breakdown voltage. VDMOS devices have become particularly attractive because of their fast switching speeds, and as such are particularly well-suited for implementation into switched-mode power supplies. FIG. 1a illustrates, in cross-section, an example of the construction of a conventional VDMOS transistor, in the form of an n-channel MOS transistor. VDMOS 2 of FIG. 1a has its drain terminal at n+ substrate 4, and a drift region provided by n-type epitaxial layer 6, which overlies substrate 4 and extends to the surface of the device as shown. P-type body regions 8 at the surface of n-type epitaxial layer 6 serve as the VDMOS body region, within which one or more n+ regions 10 serve as the source of VDMOS 2. Gate dielectric 11 and gate electrode 12 overlie a portion of p-type body regions 8 between source region 10 and the drain at n-type epitaxial layer 6. Bias is supplied to VDMOS 2 by way of metal conductors 14 contacting n+ source regions 10 and p-type body regions 8 (typically at p+ contact regions formed within p-type body regions 8, not shown), so that the body region of VDMOS 2 is biased at the source potential. Other conductors (not shown) contact gate electrode 12 and substrate 4 to provide gate and drain bias, respectively. As in any n-channel MOS transistor, vertical power VDMOS 2 is biased into the on-state by a voltage at gate electrode 12 that exceeds the transistor threshold voltage under sufficient drain-to-source bias, which will be very high (e.g., as high as several hundred volts) in typical power applications. As shown in FIG. 1a, on-state source-drain current Ids conducts from source regions 10 laterally along an inversion layer in the body region of p-type body regions 8, and vertically through epitaxial layer 6 into substrate 4 at the transistor drain. The on-resistance of VDMOS 2 includes the channel resistance $R_{ch}$ in p-type body regions 8, but is typically dominated by the resistance $R_{epi}$ of n-type epitaxial layer 6 because of the thickness and relatively light dopant concentration of that layer. While an increase in the doping concentration of epitaxial layer 6 would reduce resistance $R_{epi}$ and thus reduce the overall on-resistance of VDMOS 2, typical VDMOS devices must withstand high drain-to-source voltages (e.g., on the order of hundreds of volts) in the off-state. Because the breakdown voltage of VDMOS 2 is directly related to the thickness of its n-type epitaxial layer 6 (i.e., the VDMOS "drift" length), and is inversely related to the dopant concentration of the more lightly-doped epitaxial layer 6, this structure presents a tradeoff between on-resistance and off-state breakdown voltage.

Also as known in the art, "superjunction" VDMOS transistors address this tradeoff. FIG. 1b illustrates an example of such a conventional superjunction VDMOS 2', also for the case of an n-channel device. Superjunction VDMOS 2' is constructed similarly as non-superjunction VDMOS 2 of FIG. 1a insofar as the surface structures (p-type body regions 8, n+ source regions 10, gate electrode 12, etc.) are concerned. However, in contrast to the non-superjunction VDMOS 2 of FIG. 1a, the epitaxial region of superjunction VDMOS 2' is filled with p-type doped "pillars" 9 formed into epitaxial layer 6'. These p-type pillars 9 may be constructed by ion implantation during the formation of epitaxial layer 6' silicon, for example in a multiple step epitaxial process in which a p-type pillar implant is performed after epitaxy of a portion of layer 6', such that each pillar 9 is formed as a number of vertically aligned segments. P-type body regions 8 and n+ source regions 10 are typically self-aligned with gate electrode 12, with p-type body regions 8 typically implanted prior to the n+ source implant, and receiving a dedicated drive-in anneal, so as to extend farther under gate electrode 12 than its corresponding n+ source region 10, with p-type body regions 8 typically extending slightly into the surface region of the n-type epitaxial region. The dopant concentration of p-type body regions 8 is optimized for the desired MOSFET characteristics, such as threshold voltage and punch-through, while the dopant concentration of p-type pillars 9 is optimized for charge balance in the off-state, and will typically be more lightly doped than body regions 8. In the on-state, VDMOS 2' conducts source-drain current Ids in the same manner as described above for non-superjunction VDMOS 2, in this case with current conducted through the n-type drift regions presented by the portions of n-type epitaxial layer 6' between p-type pillars 9. In the off-state, however, p-type pillars 9 and the n-type drift regions of epitaxial layer 6' will essentially fully deplete under the typical high drain-to-source voltage, that is, because of the additional p-type material presented deep into the structure by pillars 9, a corresponding amount of charge will also deplete from n-type epitaxial layer 6' to attain charge balance. This additional charge cancellation in the off-state resulting from pillars 9 according to this superjunction construction enables epitaxial layer 6' to have a higher dopant concentration, and thus a lower on-state resistance $R_{epi}$, without adversely affecting the breakdown voltage in the off-state.

FIG. 1c illustrates the construction of a conventional trench gate superjunction VDMOS device. In this example, gate electrode 12' of VDMOS transistor 2" is disposed within a trench etched into the surface of the device, insulated from the surrounding semiconductor by gate dielectric 11'. The channel region of VDMOS 2" in body region 8 is thus oriented vertically, adjacent to gate dielectric 11' and gate electrode 12'. Pillars 9 extend below body region 8' to provide charge cancellation for VDMOS 2" in the off-state as described above.

As also known in the art, in order to support the high currents required of the intended application, VDMOS transistors are typically constructed as multiple parallel-connected source and body regions, and corresponding gate electrodes, typically arranged in "stripes" or as an array of cells within the "core" or active region of the device (i.e., that region of the integrated circuit die that passes source-drain current in the on-state). In the off-state, the top surface of the core region will be at or near the gate and source voltage, at ground potential, while the substrate will be at or near the applied drain voltage. An electric field in this core region will be oriented vertically from the fully depleted core region to the substrate, and must remain below the critical electric field for the semiconductor at which avalanche begins, typically about $3 \times 10^7$ V/m for silicon.

In this construction, however, the top outer edge of the integrated circuit device will also be at or near the voltage applied to the substrate (i.e., the drain terminal). In the off-state, a lateral electric field, parallel to the surface of the device, will thus also be present between the core region and the perimeter of the device. In order to avoid junction breakdown in this lateral direction, conventional VDMOS devices typically include a termination region surrounding the core region to laterally sustain the off-state drain-to-source voltage. Functionally, this termination region is intended to smoothly twist the electric field from vertical (at the core) to horizontal (at the outer edge of the die) while preventing the peak electric field from reaching the critical electric field.

Conventionally, the width of the termination region will be made of sufficient size (width) to lower the electric fields simply by increasing the distance over which the voltage gradient extends, thus avoiding breakdown within the termination region by maintaining the electric field magnitude below the critical electric field. By ensuring that the termination region breakdown voltage is sufficiently high, the device breakdown performance will be dominated by the larger core region of the device, allowing energy to be dissipated over a larger area and preventing localized heating that could lead to device destruction. However, the termination region does not add to on-state drive current, and therefore the chip area consumed to provide the termination region is essentially "overhead" from the standpoint of current delivered per unit of chip area. Minimization of the termination region area while still providing excellent breakdown characteristics, including both high breakdown voltage and low off-state current, is therefore desirable.

By way of further background, the use of field plates to set surface potentials to control the depletion region boundaries in such structures as vertical power diodes and power transistors is known. As known in the art, field plates refer to conductor or semiconductor structures at or near the surface of the power device that provide equipotential surfaces outside of the core region; these field plates may be biased to a desired potential, or may be left electrically floating. These equipotential surfaces alter the shape of the depletion layer in the underlying semiconductor, which redirect the electric field lines and increase the radius of curvature of the depletion layer boundary, thus increasing the breakdown voltage of the device. Guard rings, in the form of doped regions of opposite conductivity type within the semiconductor are also known in the art for similarly controlling the radius of curvature of the depletion layer boundary. In structures that present the possibility of a parasitic thyristor (i.e., a p-n-p-n structure), these guard rings are tied to an appropriate bias voltage to prevent triggering of that thyristor and latchup of the device.

BRIEF SUMMARY OF THE INVENTION

Disclosed embodiments provide a vertical power transistor structure with improved breakdown characteristics.

Disclosed embodiments provide such a structure that can be constructed with reduced termination region chip area.

Disclosed embodiments provide such a structure that can be readily implemented into existing manufacturing process flows.

Disclosed embodiments provide such a structure that can be realized in VDMOS, IGBT, and vertical power diode devices.

Disclosed embodiments provide such a structure that can be applied to both superjunction and non-superjunction device types.

Other objects and advantages of the disclosed embodiments will be apparent to those of ordinary skill in the art having reference to the following specification together with its drawings.

Embodiments of the invention may be implemented into a vertical semiconductor power transistor structure, such as a vertical drift metal-oxide-semiconductor field-effect transistor (VDMOS), constructed to include a core region of multiple source regions of a first conductivity type formed within body regions of a second conductivity type, both at the surface of a semiconductor layer of the first conductivity type. One or more termination structures, such as doped regions, conductors, and insulators, surround the core region. Within corner regions defined by rectangular boundaries of the individual integrated circuit device, perimeter edges of one or more of the termination structures are pulled away from the core region according to a non-circular second-order smooth, non-circular curve. Accordingly, these embodiments effectively stretch the voltage drop across the termination region over a longer distance, into the corners, lowering the local electric field and improving the breakdown characteristics of the power device.

Other embodiments of the invention may be implemented into a vertical superjunction power transistor structure, such as a vertical drift metal-oxide-semiconductor field-effect transistor (VDMOS), constructed to include a core region of multiple source regions of a first conductivity type formed within body regions of a second conductivity type, both at the surface of a semiconductor layer of the first conductivity type. In these embodiments, one or more guard rings of a continuous electrically floating doped region, of opposite conductivity type from the substrate, are disposed in the termination region surrounding the core region of the device. The guard ring may be shallower than, or extend as far as, the depth of the superjunction pillars.

BRIEF DESCRIPTION OF THE SEVERAL VIEWS OF THE DRAWING

FIGS. 2a and 2b are plan views of the layout of a VDMOS transistor in which embodiments may be implemented.

DETAILED DESCRIPTION OF THE INVENTION

The one or more embodiments described in this specification are implemented into vertical drift metal-oxide-semiconductor (VDMOS) field-effect transistors of the superjunction type, as it is contemplated that such implementation is particularly advantageous in that context. However, it is also contemplated that concepts of this invention may be beneficially applied to other applications, for example trench gate VDMOS devices, non-superjunction VDMOS transistors, and vertical power devices of other types such as insulated gate bipolar transistors (IGBTs), vertical power diodes, and the like. Accordingly, it is to be understood that the following description is provided by way of example only, and is not intended to limit the true scope of this invention as claimed.

As mentioned above in the Background of the Invention, the design of the termination region of a vertical power switching device, such as a power VDMOS device, IGBT, vertical power diode, and the like, is important in attaining the desired off-state current-voltage characteristics, including a low leakage current prior to breakdown and a sharp post-breakdown I-V curve at a sufficiently high breakdown voltage. To achieve this goal, the termination region must block the surface voltage on all sides and at all corners of the active core region of the device that supports current conduction in the on-state. Optimization of the termination region for a given device architecture involves such factors as doping levels and geometry of the various semiconductor doped regions, geometry and thicknesses of insulator and conductor elements at or above the surface of the device, and the like. The embodiments described in this specification will largely concern the geometric design and placement of these elements in the termination region, as will be apparent from the following description.

Figure 1A:
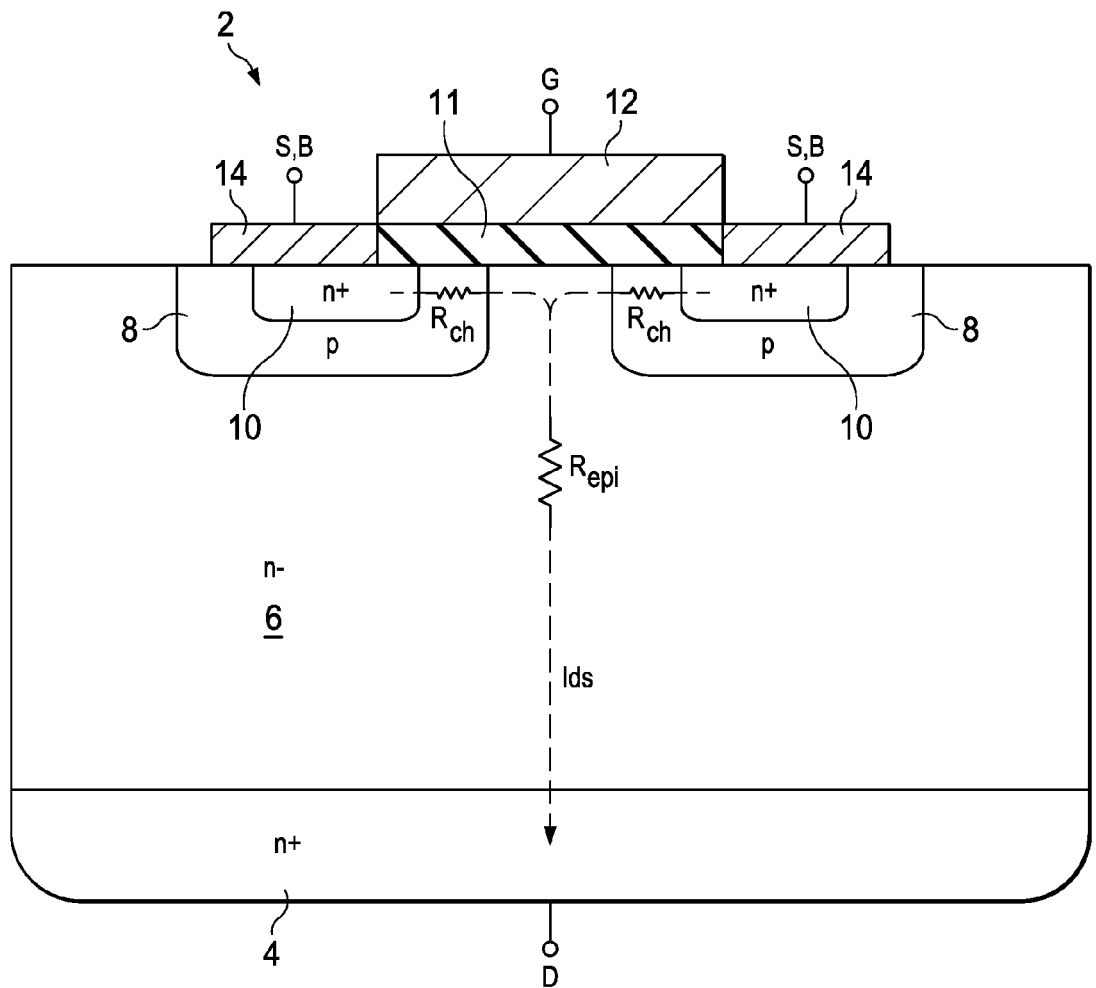
FIGS. 1*a*, 1*b*, and 1*c* are cross-sectional views of conventional non-superjunction and superjunction VDMOS transistors, respectively.
Figure 1B:
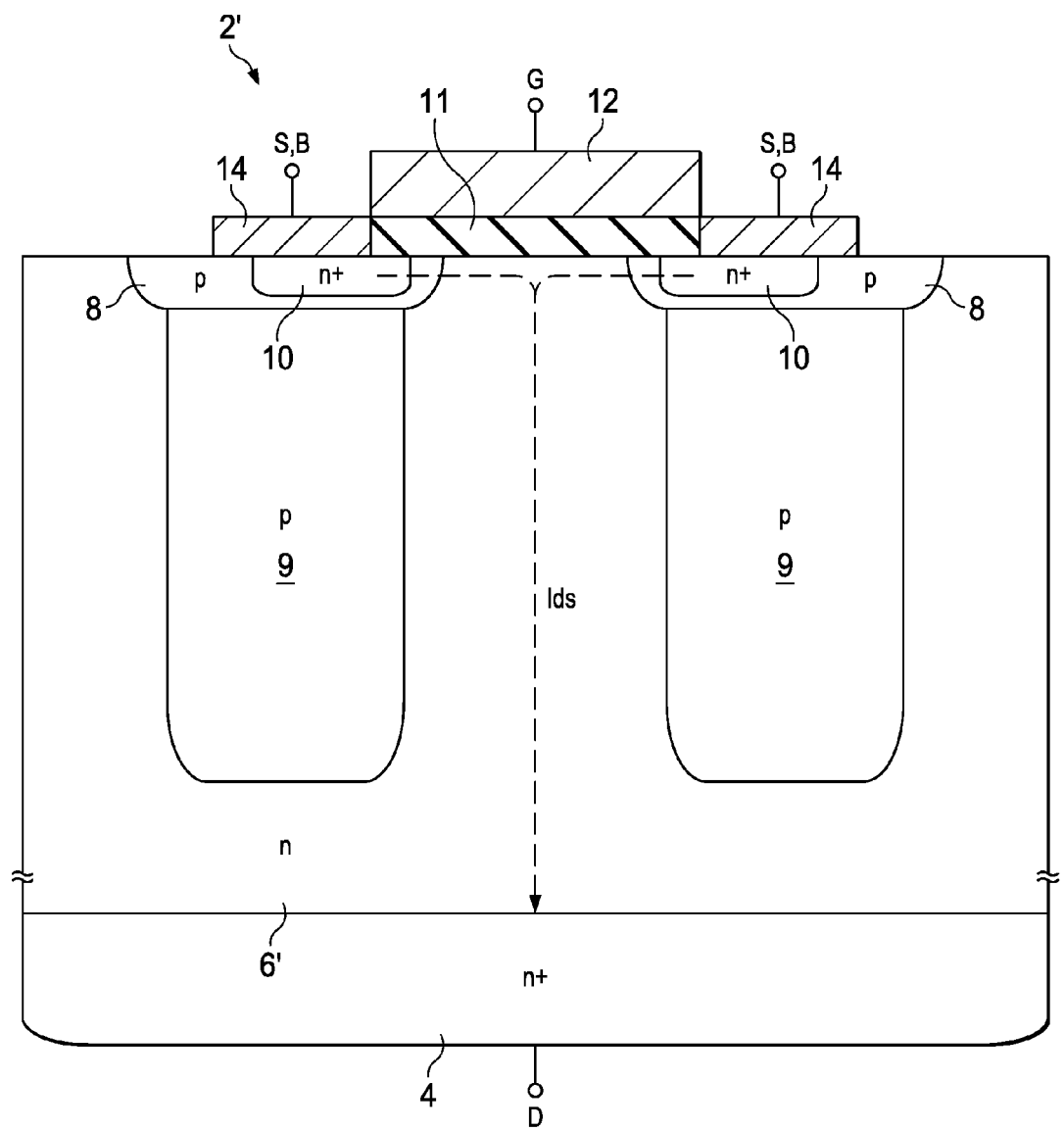
Figure 1C:
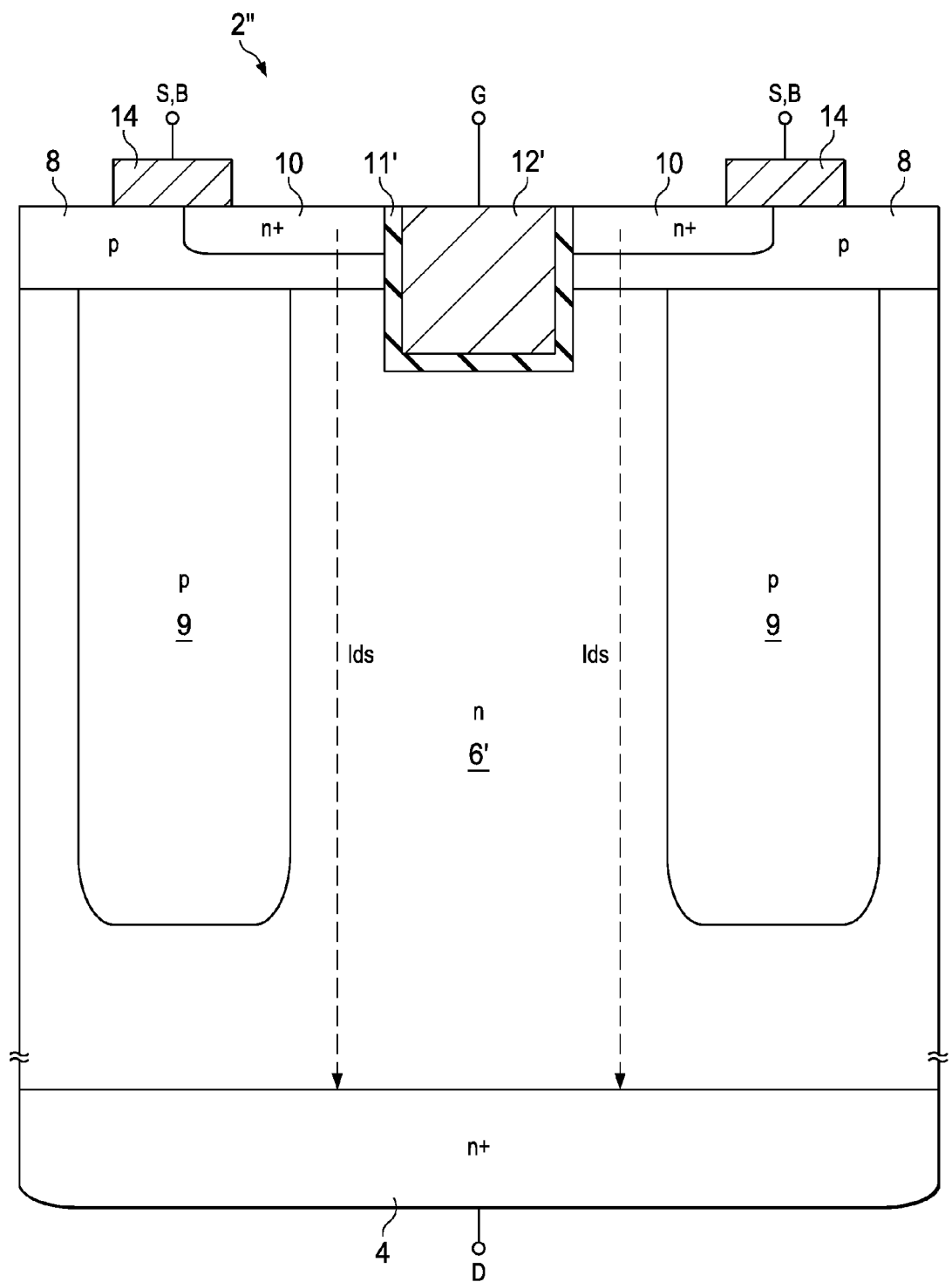
Figure 2A:
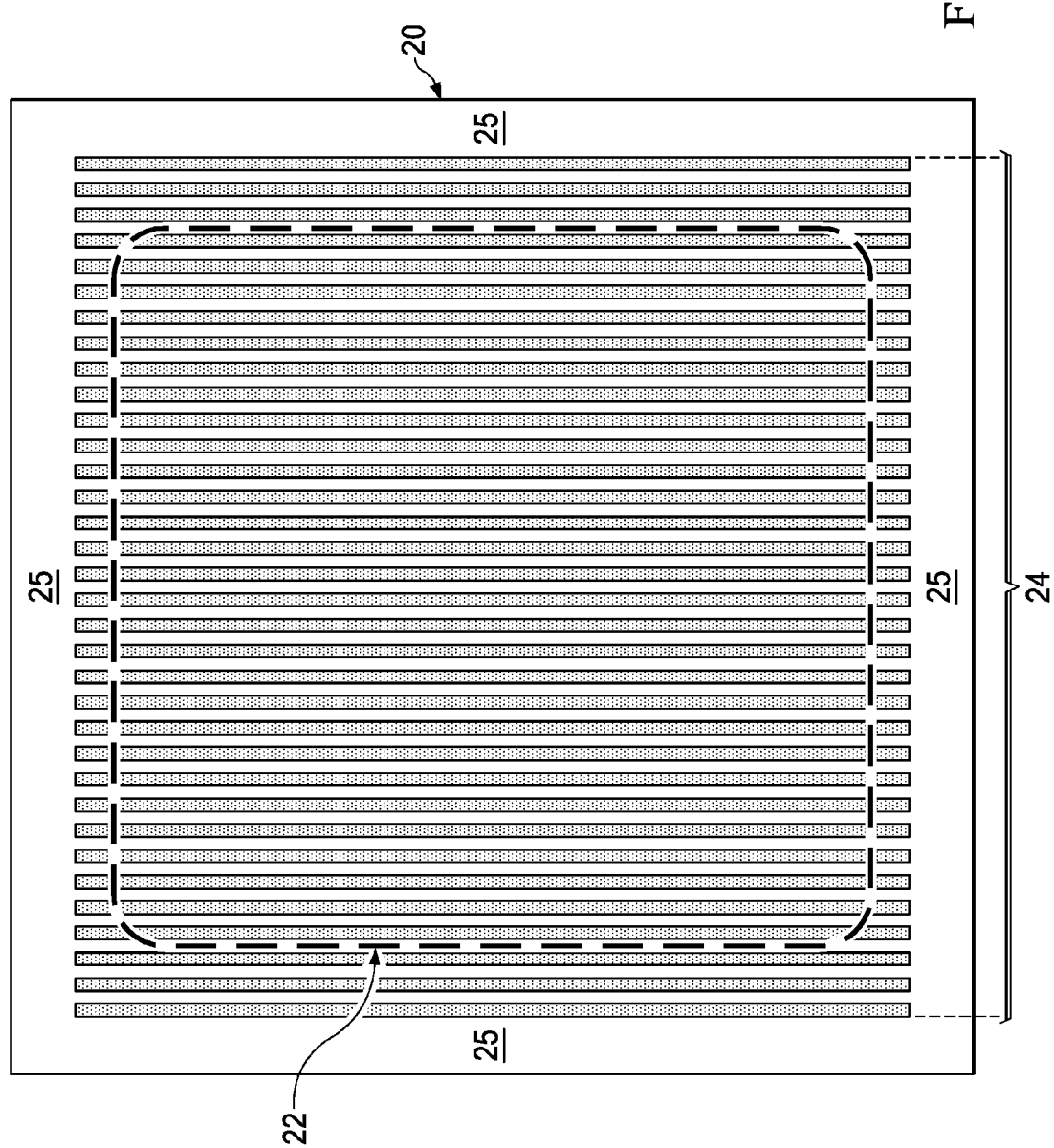

FIG. 2a illustrates, in plan view, the arrangement of various features in the construction of superjunction VDMOS 20 according to a preferred embodiment of the invention. These embodiments will be described for the example of an n-channel VDMOS transistor, and as such (referring to FIGS. 1a and 1b described above) will be described as formed in an n-type silicon substrate with n-type epitaxial silicon grown over that substrate; it is of course contemplated that those skilled in the art having reference to this specification will be readily able to adapt these embodiments to alternative types of power devices such as trench gate VDMOS transistors, non-superjunction VDMOS devices, p-channel VDMOS transistors, IGBTs, and vertical power diodes, without undue experimentation. In addition, this embodiment will be described in the context of a discrete power device, namely in which an integrated circuit die realizes a single device, specifically a power device such as VDMOS 20. In this sense, references to the edge of the die refer to the physical edge of the semiconductor body in which the relevant power device (e.g., VDMOS 20) is disposed. Of course, it is to be understood that this embodiment and variations thereof may alternatively be implemented in larger scale integrated circuits, including one or more additional active or passive elements such as additional power devices, logic circuits, analog circuits, etc.

The view of FIG. 2a illustrates the location of p-type pillars 24 in VDMOS 20, in the form of parallel "stripes" extending across the interior of the die at which VDMOS 20 is being formed. In this superjunction case, p-type pillars 24 are formed into (and along with) an n-type epitaxial layer in the manner described above relative to FIG. 1b, and as such the n-type silicon of the epitaxial layer will be present between p-type pillars 24 in the view of FIG. 2a.

Alternatively to the p-type pillars 24 being in the form of stripes as shown in FIG. 2a, p-type pillars 24 and the other corresponding elements of VDMOS 20 may be arranged as an array of "cells". U.S. Pat. No. 9,117,899, issued Aug. 25, 2015, commonly assigned herewith and incorporated herein by reference, describes an example of such a cell type geometry for the case of a trench gate VDMOS transistor.

According to this example of this embodiment, and as typical for planar gate VDMOS devices, p-type body regions will be formed within those pillars 24, typically extending into the n-type epitaxial region under the gate, and the n+ source regions will be subsequently formed within these p-type body regions, as described above relative to FIG. 1b. These p-type body regions and n+ source regions will be formed within a central region of the die that will be referred to as "core" region 22 in this description. More specifically, core region 22 in this embodiment is a "functionally active" region of the surface of VDMOS 20, which is a portion of that surface at which a relatively thick insulator layer, such as field oxide, is not present; rather, a thin oxide such as a gate dielectric layer will generally overlie core region 22. The boundary of core region 22 in FIG. 2a illustrates the location of the edge of the thick insulator, such that p-type body regions, n+ source regions, and contacts to those body and source regions may be made within that boundary, i.e. within core region 22. Conversely, the thick insulator prevents the formation of p-type body regions and n+ source regions outside of core region 22. FIG. 2b illustrates the arrangement of p-type body regions 26, which as described above are formed within and typically extending outside of p-type pillars 24 (not shown in FIG. 2b, for the sake of clarity). As shown in FIG. 2b and as noted above, p-type body regions 26 are present only within core region 22, as are n+ source regions and contact strips (not shown in FIG. 2b, for the sake of clarity).

As noted above, this embodiment of the invention may alternatively be implemented in a non-superjunction VDMOS transistor, in which case no pillars 24 are present either within or outside of core region 22. In that non-superjunction implementation, p-type body regions 26 (and of course n+ source regions and contacts to each) are present only within core region 22 in the manner shown in FIG. 2b.

As shown in FIGS. 2a and 2b, termination region 25 corresponds to portions of VDMOS 20 outside of core region 22, in this example extending to the edge of the integrated circuit die. In some embodiments, as will be described below, a "transition" region may be considered as present just inside the edge of core region 22. In any case, as noted above, some instances or portions of p-type pillars 24 may be present with or extend outside of core region 22 and within termination region 25, but these instances will lack body regions 26. As such, core region 22 will substantially support the vertical on-state source/drain current of VDMOS 20, while little or no on-state source/drain current will be supported by or otherwise pass into or through termination region 25. Rather, termination region 25 is provided in VDMOS 20 to support the lateral electric field between the die edge, at which the applied drain voltage will appear, and core region 22 that will be at the ground level of the body and source regions (and gate electrodes) of VDMOS 20 in the off-state.

Typically in conventional power semiconductor devices, device termination regions and structures located in those termination regions (i.e., termination structures) are structured in a geometrically similar fashion along all sides of the device. For purposes of this description, the term "termination structures" refers to those portions of doped regions in the substrate and epitaxial semiconductor body of the device, and insulators and conductors at or near the surface of the semiconductor body, that are within the termination region. In conventional vertical power devices, the transition at a corner location of a rectangular geometry (e.g., the outer edge of the core region, or the inner edge of the termination region) from one side to a neighboring perpendicular side follows a circular curve path, essentially rotating the edge at a fixed radius around an arbitrary point to maintain the same distance from the core region in the corners as along the straight sides of the core region. It is well-known in the art that small-radius circular transitions can concentrate electric fields in three dimensions, such that these corner locations tend to dominate breakdown behavior of the device. As such, conventional termination region design using circular corners must ensure that the termination region is sufficiently wide to ensure that the breakdown performance, at these worst-case corners, meets the device requirements.

It has been observed, according to this invention, that the generally rectangular arrangement of the device core region and termination region structures, all with circular curved corners, often results in a large unused region in the corners of the termination region, between the core region and the rectangular corner of the device. FIG. 2b identifies corner location 25C as corresponding to that portion of termination region 25 extending from the locations at which sides of core region 22 begin to deviate from parallel to the straight edges of the integrated circuit die. According to some embodiments, the edges of one or more termination structures, such as field plates, doped regions, insulator films, and conductors, within these otherwise-unused corner locations 25C of termination region 25 are designed in shape and placement so as to improve the breakdown characteristics (i.e. raise the breakdown voltage) at these corners relative to the conventional circular curved edges described above. More specifically, the selection of second order smooth, non-circular paths (i.e., paths of varying local radii of curvature) for these termination structures so as to "stretch" these edges closer to the corner of the die, farther from core region 22 in the corner locations than along the straight sides of core region 22, enables the applied drain voltage to be dropped over a longer distance, lowering the overall electric fields in termination region 25 below the critical field at which avalanche breakdown occurs.

Figure 3A:
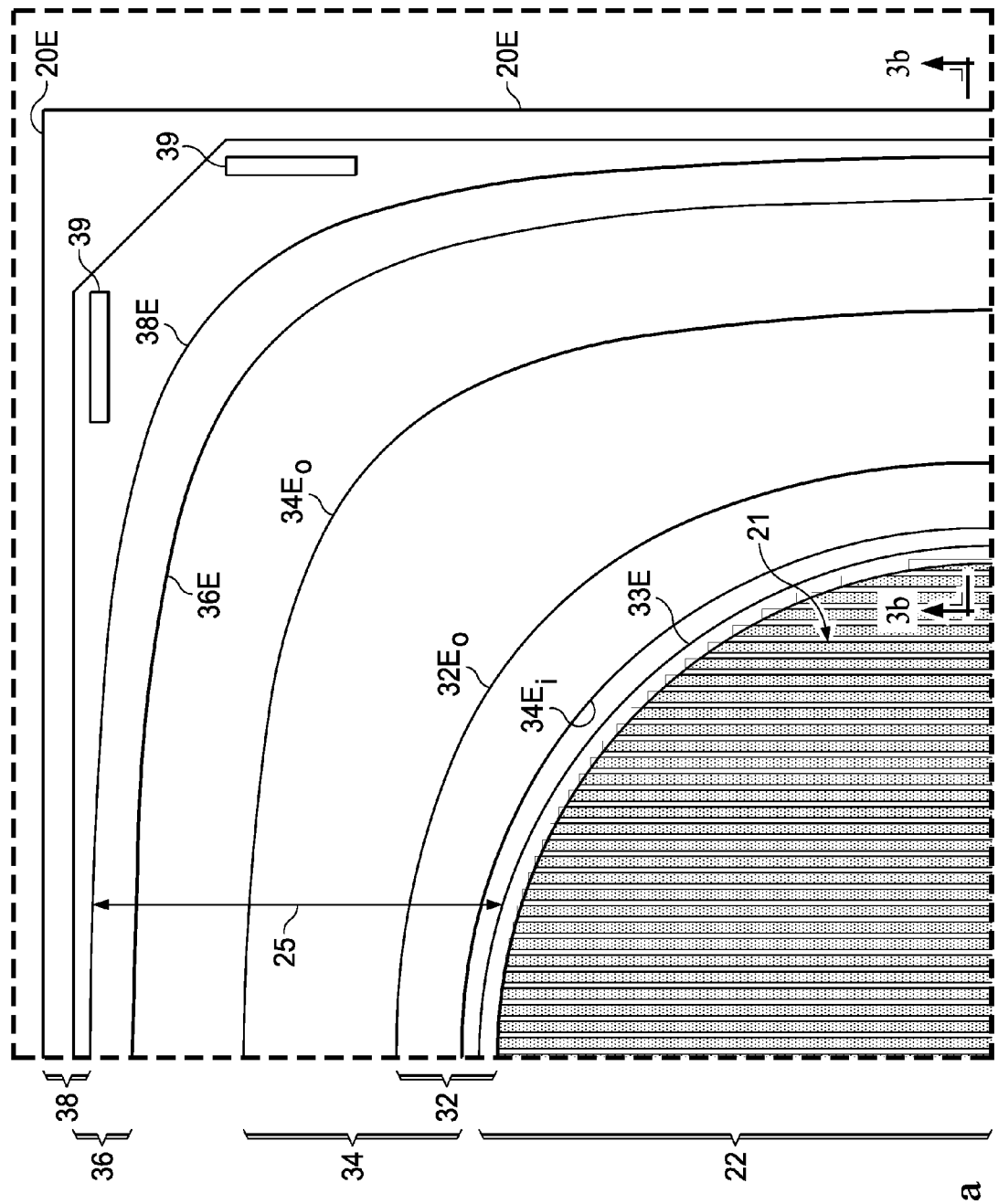
FIG. 3a is a plan view of a corner portion of an integrated circuit including a VDMOS transistor constructed according to an embodiment.
Figure 3B:
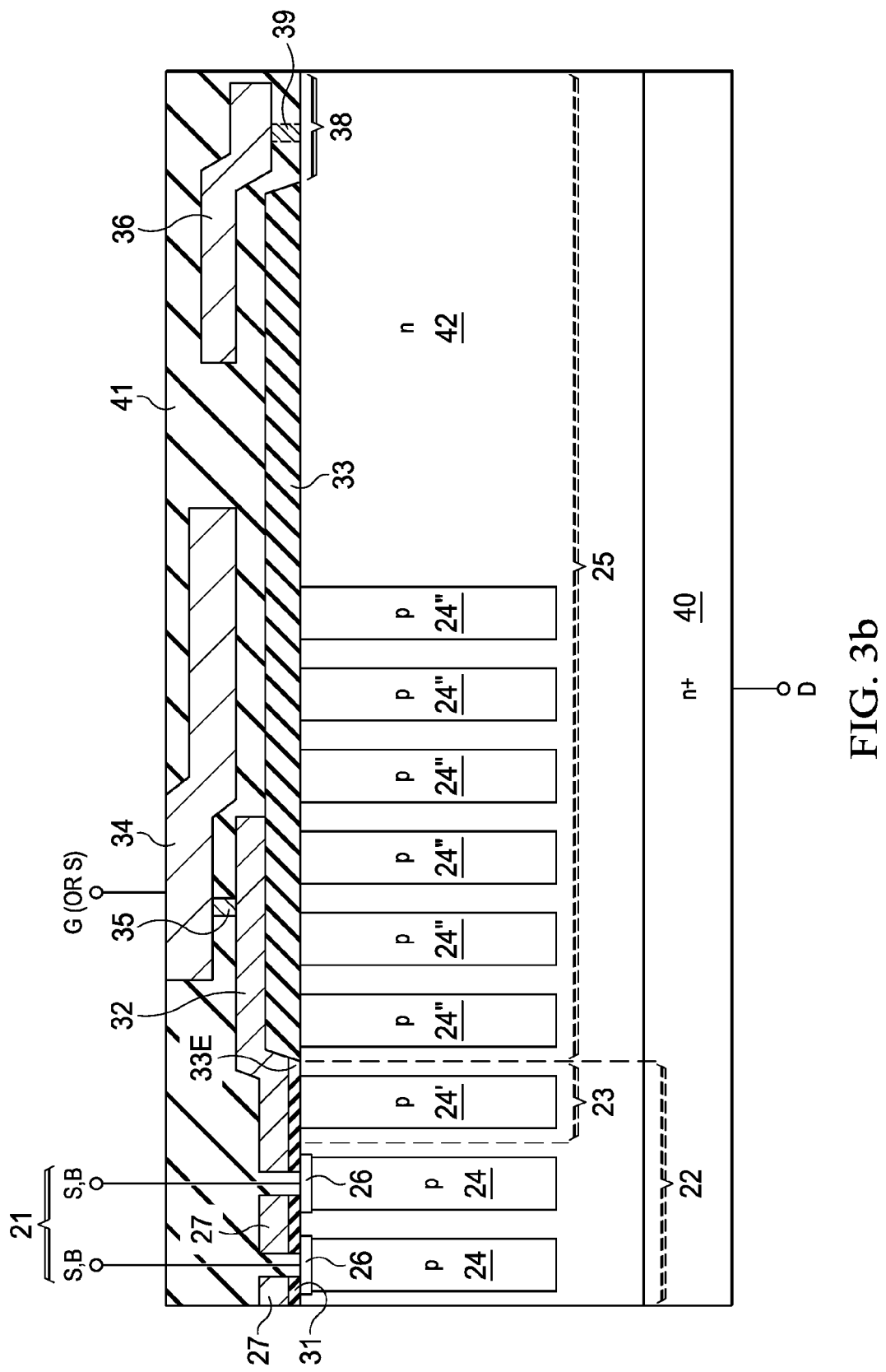
FIGS. 3b and 3c are cross-sectional views of different implementations of the integrated circuit portion of FIG. 3a according to that embodiment.
Figure 3C:
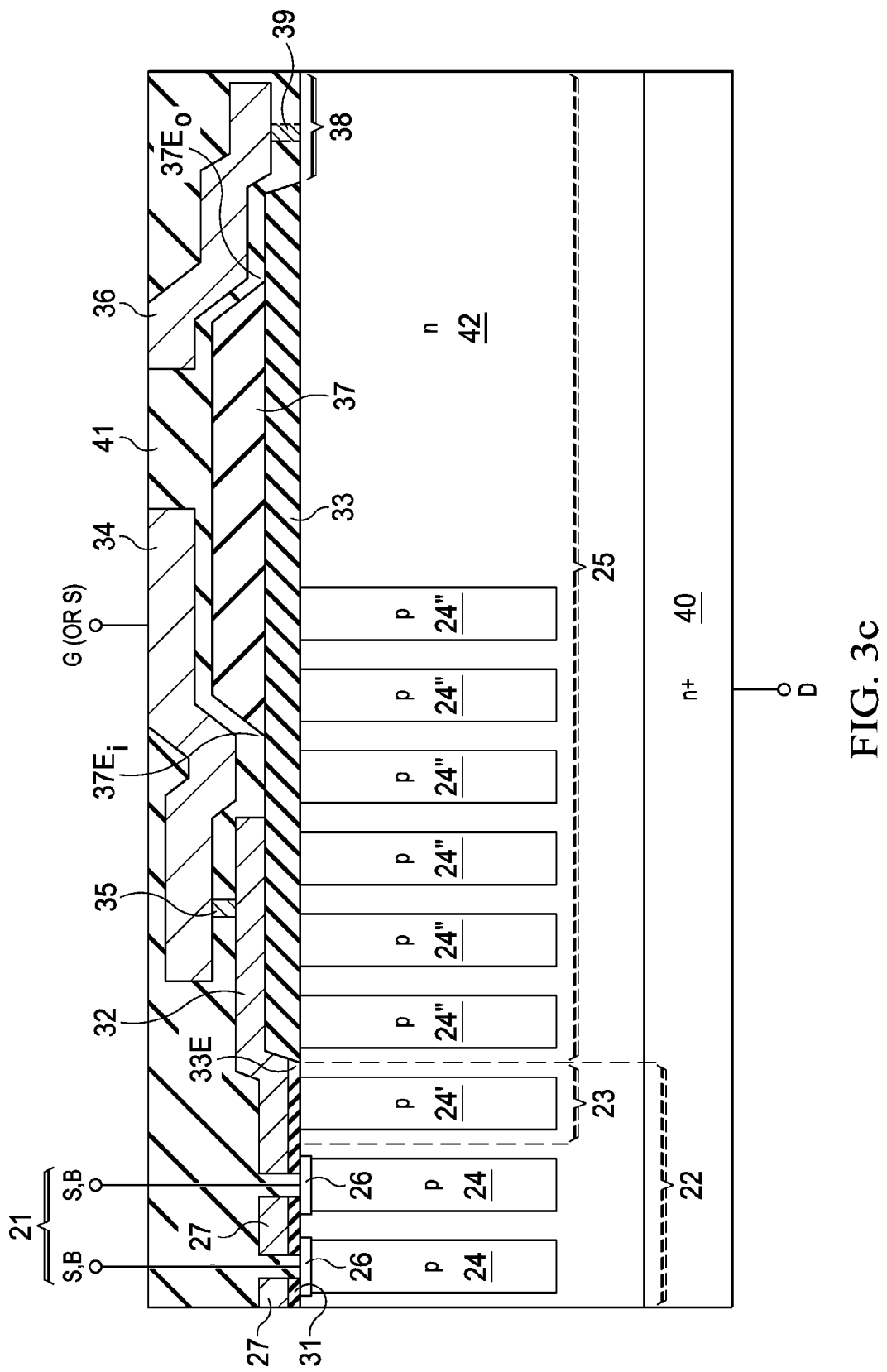

Referring now to FIGS. 3a through 3c, the construction of VDMOS 20 according to this superjunction embodiment will now be described in detail with reference to one of the corner locations 25C of the integrated circuit die in which VDMOS 20 is realized. It is to be understood that the other three corners of the die will be similarly constructed.

FIG. 3a illustrates the layout of various features at the upper right-hand corner location 25C of the integrated circuit die shown in FIGS. 2a and 2b, and FIG. 3b is a corresponding cross-section. In FIG. 3a, portions of some features are shown as underlying other features, even though those portions would not necessarily be visible in the actual physical device. In this embodiment and as described above relative to FIGS. 2a and 2b, core region 22 includes the portion of VDMOS 20 in which the body and source regions are present and connected to one another at contact strips 21, and thus through which source/drain current will flow when VDMOS 20 is in the on-state. For purposes of this description, core region 22 will be considered as bounded by the edge of a relatively thick insulator layer, such as field oxide 33 as shown in FIG. 3b. In this embodiment, p-type pillars 24 are arranged in stripes within core region 22, with contacts 21 made to n+ source regions (not shown) and p-type body regions 26 as described above; as known in the art, contacts 21 to body regions 26 will typically be made to implanted p+ regions (not shown) to provide good ohmic contact to body regions 26. FIG. 3b shows pillars 24', 24" that lack p-type body and n+ regions and that therefore do not support on-state source/drain current. Pillars or portions of pillars that lack p-type body and n+ regions, both of which are required to support on-state source/drain current, are hereafter referred to as non-active pillars. In this example, non-active pillar 24' does not underlie field oxide 33 and lies within "transition" region 23 at the edge of core region 22; in this example, the masked implant that defines the locations of p-type body regions 26 (or, alternatively, the locations of gate electrode polysilicon openings) excludes these transition pillars 24'. Non-active pillars 24" underlie field oxide 33 and as such are within termination region 25. In the example of FIG. 3b, pillars 24" extend only part of the way into termination region 25 from the boundary of core region 22.

In this embodiment, polysilicon field plate 32 is provided at the edge of core region 22. Polysilicon field plate 32 is constructed in the same level of polysilicon as gate electrodes 27 of VDMOS 20 within core region 22 (as shown in FIG. 3b). In some implementations, poly field plate 32 may be contiguous and thus electrically connected to gate electrodes 27; alternatively, poly field plate 32 may be physically separated from the polysilicon elements defining gate electrodes 27. In core region 22 (including transition region 23), poly field plate 32 and gate electrodes 27 overlie gate dielectric 31, while in termination region 25, poly field plate 32 overlies field oxide 33. Polysilicon field plate 32 extends contiguously on all sides and around all corners around the perimeter of core region 22.

Also in this embodiment, metal field plate 34 is provided in termination region 25, extending contiguously on all sides and around all corners around core region 22. In this example, metal field plate 34 is formed in a first level of metal conductors in VDMOS 20, so as to be near the surface of n-type epitaxial layer 42; alternatively, metal field plate 34 may be formed in a higher metal level, so long as the desired off-state effect on the off-state electric field in termination region 25 is attained. As shown in FIGS. 3a and 3b, metal field plate 34 overlies poly field plate 32 up to inner edge 34E$_i$, and extends beyond outer edge 32E$_o$ of poly field plate 32 into termination region 25. In this example, metal field plate 34 is separated from poly field plate 32 in the usual manner by interlevel dielectric 41, through which contacts 35 are formed to connect metal field plate 34 to poly field plate 32.

In this embodiment, metal field plate 34 and thus poly field plate 32 receive a low voltage relative to the drain voltage in the off-state. If poly field plate 32 is contiguous or otherwise connected to gate electrodes 27 in core region 22, the gate voltage G may be applied to metal field plate 34 to control conduction by VDMOS 20 in core region 22. Alternatively, if poly field plate 32 is not connected to gate electrodes 27, the source voltage S (i.e., ground potential) may be applied to metal field plate 34.

Termination region 25 extends outside of field plates 32, 34 to edge 20E of the integrated circuit die in which VDMOS 20 is realized. N-type epitaxial layer 42 overlying substrate 40 is present at the surface below field oxide 33 in the outer portion of termination region 25, beyond the location of non-active p-type pillars 24" from core region 22. Active region 38 of the surface of epitaxial layer 42 is exposed near die edge 20E. In this embodiment, high-voltage metal conductor 36 extends contiguously on all sides and around all corners around core region 22 and much of termination region 25, near the outer perimeter of the die. Metal conductor 36 contacts active region 38 at contacts 39, and extends inwardly from the die perimeter into termination region 25, overlying the outer portion of field oxide 33.

As discussed above, when VDMOS 20 is in the off-state, core region 22 will be fully depleted and at the low voltage (ground) potential of the device source and body regions and gate electrodes, while high-voltage active region 38 (and substrate 40) will be at the applied drain voltage, which may be as high as several hundred volts. These potentials establish an electric field laterally between high-voltage active region 38 and the depleted core region 22. With VDMOS 20 in the off-state, poly field plate 32 and metal field plate 34 serve as low voltage equipotential surfaces and structures within termination region 25 outside of the active core region 22, while high-voltage metal conductor 36 provides a high voltage equipotential surface extending from die edge 20E into termination region 25. The topology, shape, and properties of these equipotential surfaces will serve to control the electric field in termination region 25 when VDMOS 20 is turned off. More specifically, the shape and placement of the edges of field plates 32, 34, high voltage conductor 36, and active region 38 at corner locations 25C of termination region 25 take advantage of the additional area of those corners to improve the breakdown performance of VDMOS 20. This improvement is attained by selection of second-order smooth, non-circular paths for these edges and thus the corresponding termination structures to drop the drain voltage relative to the ground potential at core region 22 over a longer distance as compared with conventional designs, while maintaining the electric field strength below the critical field for the semiconductor.

In the embodiment shown in FIG. 3a, edge 33E is the inner edge of field oxide 33, which for purposes of this description establishes the outer edge of core region 22 (in this description of the termination structures, directional terms such as "inner", "outer", "inside", and "outside" are relative to core region 22). Outer edge 32E$_o$ of poly field plate 32 is located outside of field oxide edge 33E, while inner edge 34E$_i$ of metal field plate 34 is located outside of field oxide edge 33E and inside of outer edge 32E$_o$ of poly field plate 32. Outer edge 34E$_o$ of metal field plate 34 is located outside of outer edge 32E$_o$ of poly field plate 32. High-voltage conductor 36 has an inner edge 36E located outside of outer edge 34E$_o$ of metal field plate 34, and active region 38 has an inner edge 38E located outside of inner edge 36E of high-voltage conductor 36. The locations of outer edges of high-voltage conductor 36 and active region 38 are not of particular importance in controlling the off-state electric fields in this embodiment.

FIG. 3c illustrates an alternative arrangement of termination region 25 of VDMOS 20, in which thick oxide 37 is formed in termination region 25, with the outer portion of metal field plate 34, including its outer edge 34E$_o$, extending over that thick oxide 37. Other features in this arrangement are the same as described above relative to FIG. 3b. According to this embodiment, thick oxide 37 is also considered as a termination structure, in that its location affects the height of metal field plates 34, 36, and thus the shape of the electric field in termination region 25. Accordingly, the shape and placement of inner edge 37E$_i$ and outer edge 37E0 of thick oxide 37 can be designed, in this implementation, to take advantage of the additional area in the corners of the die so as to improve the breakdown performance of VDMOS 20 according to this embodiment.

The ideal optimized design of the termination structure edges within termination region 25 would follow a solution of Poisson's equation (for electrostatics) as applied to the boundary conditions of the geometrical placement of those device conductors and regions that establish the off-state potential at the inner edge (field oxide edge 33E) and outer edge (active region edge 38E) of termination region 25C, considering the geometrical arrangement of conductors and dielectrics within termination region 25. As known in the art, physical principles and corresponding mathematical derivations require solutions to Poisson's equation to be analytic and $2^{nd}$-order smooth in the mathematical sense. According to these embodiments, termination structure edges that shape and define potentials and electric fields within termination region 25 have shapes that at least closely approximate analytic and $2^{nd}$-order smooth curves with varying local radii of curvature. These properties ensure the absence of "kinks", or abrupt changes, that could locally concentrate the off-state electric field above the critical field for the semiconductor, resulting in the onset of avalanche breakdown.

It is well known from mathematical principles that solutions to Poisson's equation within complicated geometric regions can often be reached by taking a known simple-geometry solution and "stretching" the solution by way of a conformal map to fit a new region. According to one embodiment, a conformal map is applied in this fashion to "stretch" the geometric edges of field plates 32, 34, high-voltage conductor 36, active region 38, and edges of insulating layers such as field oxide 33 and thick oxide 37 deeper into corner locations 25C of termination region 25, as compared with conventional constant-radius or "circular" corner geometries, to correspondingly stretch off-state equi-potential lines within VDMOS 20 further into the corner of the die, lowering the electric fields within corner location 25C as a result. This conformal map approach provides the ideally optimal shaping of the electric fields in termination region 25, and thus can optimize the chip area consumed by termination region 25 for a given drain voltage level.

It has also been observed, according to these embodiments, that the ideal optimized edges of structures in the termination region are not precisely necessary in order to achieve significant improvement in breakdown performance. Rather, it has been discovered that close approximation of a conformally mapped solution can be readily derived in the practical sense, by using a mathematical function to stretch termination structure edges in corner locations 25C of termination region 25 so as not to introduce undesirable local kinks in the electric field. According to one embodiment, the selected mathematical tool for this type of stretch is a third or higher order Bézier curve, which is by definition a $2^{nd}$-order smooth analytic function.

Figure 4A:
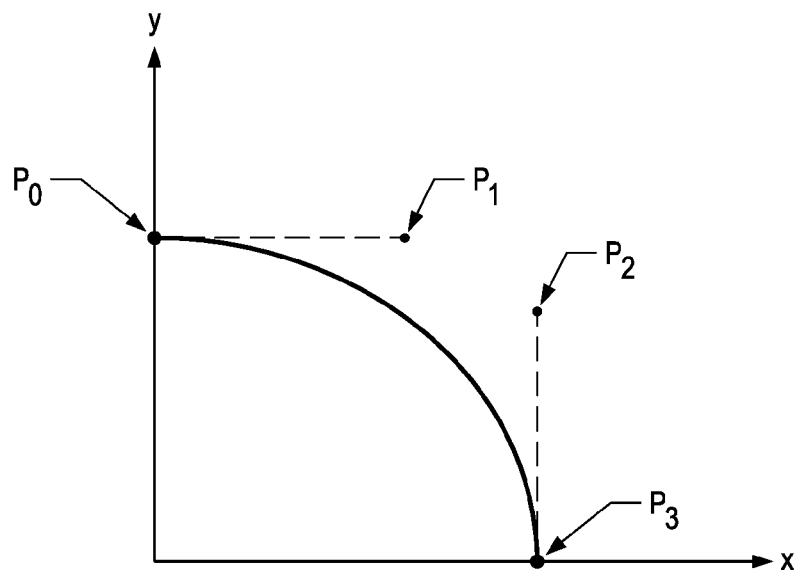
FIGS. 4a and 4b are plots of cubic Bézier curves as used in connection with this embodiment.

One example of a Bézier curve as applied to this embodiment is a $3^{rd}$-order polynomial (i.e., cubic) Bézier curve with the corresponding control points selected to approximate the desired optimal path. FIG. 4a shows a simple cubic Bézier curve as mapped into the unit-circle in quadrant 1 of the Cartesian plane, and which may be applied to corner location 25C of FIG. 3a. In this example, four control points $P_0$ through $P_3$ are selected. Control points $P_0$ and $P_3$ are at the end points of the path, which in the context of a termination structure according to this embodiment would be the points at which the edge begins to deviate from its straight sides upon entering corner location 25C. As known in the art for Bézier curves, the four control points are:

$P_0$: $x_0$, $y_0$=(0, 1) //Start point of the path
$P_1$: $x_1$, $y_1$=(s, 1) //$P_0$-$P_1$ sets the angle at which the path leaves $P_0$
$P_2$: $x_2$, $y_2$=(1, s) //$P_2$-$P_3$ sets the angle at which the path enters $P_3$
$P_3$: $x_3$, $y_3$=(1, 0) //End point of the path In the example of FIG. 4a, and as will typically be applied to these embodiments, the Bézier curve will be "regular" in the sense that it will be symmetric about the axis through its midpoint. Following selection of the control points $P_0$ through $P_3$, the curve is a parameterization in t varying continuously between 0 and 1:

$$x(t) = x_0(1-t)^3 + 3x_1 t^1 (1-t)^2 + 3x_2 t^2 (1-t)^1 + x_3 t^3$$

$$y(t) = y_0(1-t)^3 + 3y_1 t^1 (1-t)^2 + 3y_2 t^2 (1-t)^1 + y_3 t^3$$

The parameter s can be viewed as a scaling factor, in the sense that it determines how far the curve travels from control point $P_0$ to $P_1$ before turning off toward point $P_2$ (and similarly relative to control points $P_2$ and $P_3$). The scaling parameter $$s = 4\frac{(\sqrt{2}-1)}{3}$$

defines a "close" approximation to a circular path. This particular value can be derived by requiring the parametric curve to pass through a circle (i.e., choosing x=y=√2 for t=½, and solving for s). Setting scaling parameter s to be smaller than this value will pull the path inside that of a circle, while scaling parameter s with a greater value will pull the corresponding path outside that of a circle. In other words, the parameter s becomes a variable used to set the amount of the path stretching. According to this embodiment, scaling parameter s is selected to be larger than this circular value to stretch the corresponding termination structure edge farther into the corner, outside a circular path that would maintain the same distance between the edge and the core region in the corners as along the sides of the core region. This stretching of the termination structure edges increases the distance over which the blocking voltage is dropped in corner locations 25C thus reducing the corner electric fields.

Figure 4B:
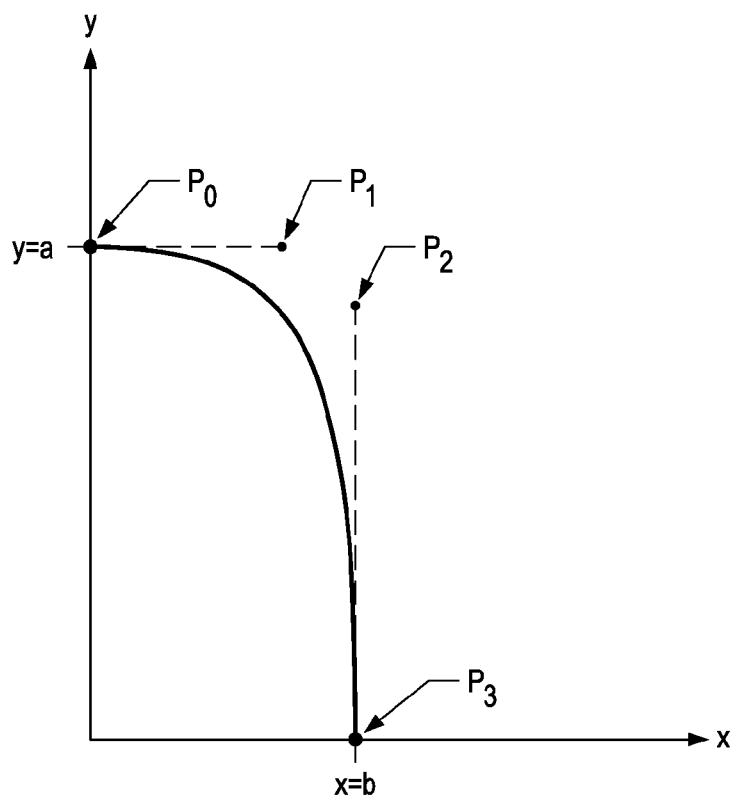

Additional degrees of freedom may be incorporated into the cubic Bézier curve as applied to these embodiments to transition a structure on the y-axis at height a to match a structure on the x-axis at distance b from the origin, considering that the termination structure edges need not be symmetrical on all four sides of VDMOS 20 if desired in shaping the blocking electric fields. In this case, the Bézier curve formulas would be modified to adopt a different set of control points $P_0$ through $P_3$ (for the cubic case):

$P_0$: $x_0$, $y_0$=(0, a) //Start point of the path
$P_1$: $x_1$, $y_1$=(s1, a) //$P_1$-$P_2$ sets the angle the path leaves $P_1$
$P_2$: $x_2$, $y_2$=(b, s2) //$P_2$-$P_3$ sets the angle the path enters $P_3$
$P_3$: $x_3$, $y_3$=(b, 0) //End point of the path In this case, the two scaling factors s1, s2 would be selected to have values that asymmetrically stretch the shape of the path outwardly from a circular path. The rate at which the path changes curvature is determined by the factors s1, s2, which will differ from one another in this approach. FIG. 4b illustrates an example of an asymmetric cubic Bézier curve according to this alternative implementation.

In any of these implementations as applied to the arrangement of the termination structures within corner locations 25C of VDMOS 20, the use of a Bézier curve according to these embodiments facilitates the stitching together of disparate regions in termination region 25 that would otherwise be difficult to connect without distorting the electric fields.

According to the embodiment shown in FIGS. 3a through 3c, several of the edges of termination structures are stretched substantially according to a cubic Bézier curve. For purposes of this description, the term "substantially", in referring to following a particular curve, refers to a structure that may not perfectly follow a path corresponding to the specified mathematical function but is sufficiently close so as to behave similarly to such a structure that perfectly follows that function, within the context of these embodiments. Specifically, in this embodiment, each of outer edge $32E_o$ of poly field plate 32, inner edge $34E_i$ and outer edge $34E_o$ of metal field plate 34, inner edge 36E of high-voltage conductor 36, and inner edge 38E of active region 38 are stretched substantially according to respective cubic Bézier curves in the example of FIGS. 3a and 3b; in the example of FIG. 3c, inner edge $37E_i$ and outer edge $37E_o$ of thick oxide 37 may also be stretched substantially according to respective cubic Bézier curves.

Figure 3D:
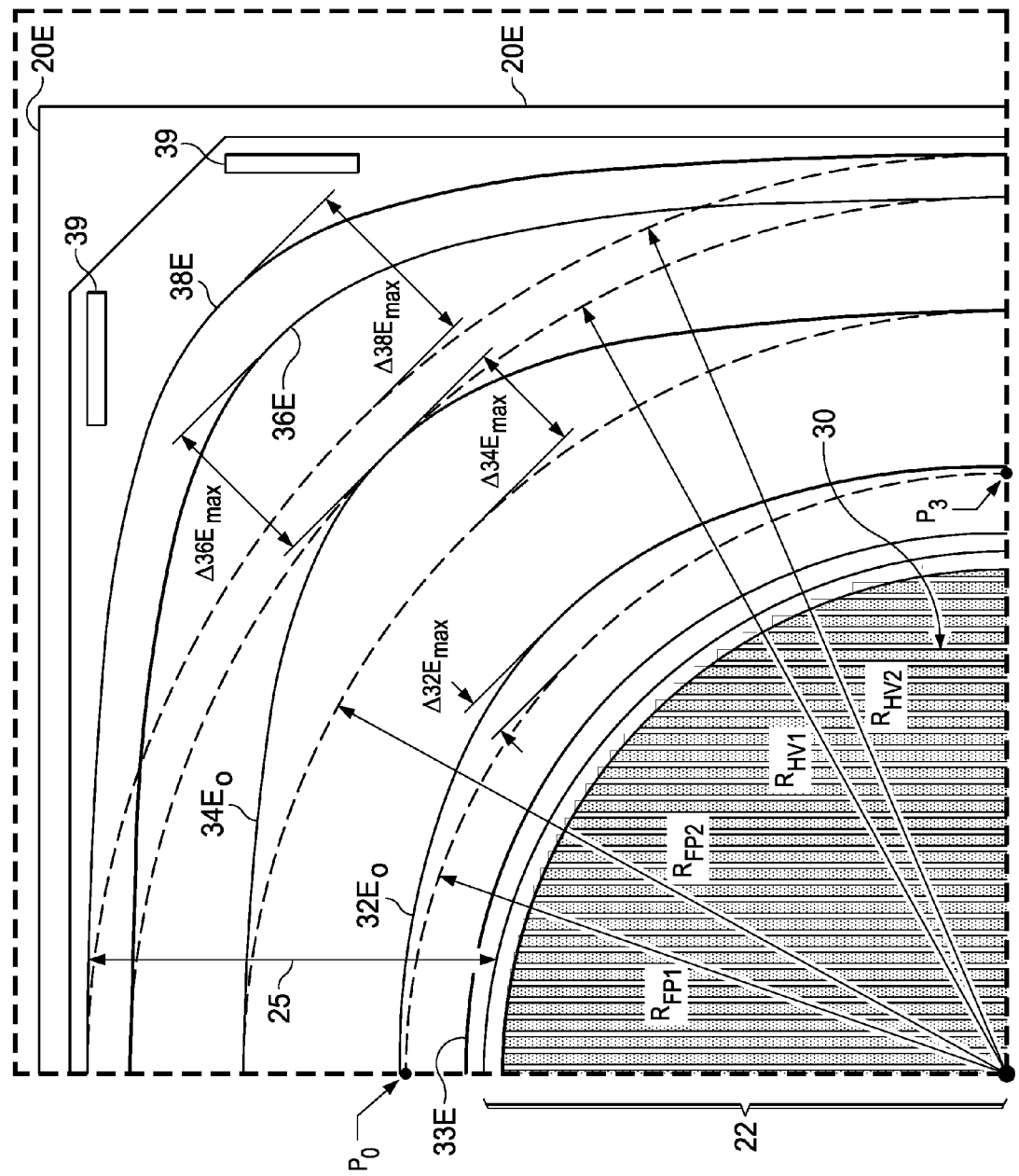
FIG. 3d is a plan view of the corner portion shown in FIG. 3a, illustrating a comparison with conventional construction.

It is useful to compare the shapes and placement of termination structure edges according to this embodiment to that of conventional circular designs. In this regard, for the structure of FIGS. 3a and 3b, FIG. 3d shows a circular path of constant radius $R_{FP1}$ which would define the outer edge of poly field plate 32 according to a conventional circular placement. This radius $R_{FP1}$ corresponds to the radius of a circle that maintains the same distance between the outer edge of poly field plate 32 and the boundary of core region 22 (i.e., field oxide edge 33E of FIG. 3a) both along the straight sides of core region 22 and in corner locations 25C. According to this embodiment in which outer edge $32E_o$ substantially follows a cubic Bézier curve from points $P_0$ and $P_3$, which are at the distance from the boundary of core region 22 along the straight sides of core region 22, with a scaling factor s greater than the circular value $$4\frac{(\sqrt{2}-1)}{3}.$$

As a result, outer edge $32E_o$ of poly field plate 32 stretches farther away from core region 22 within corner location 25C than its distance along the straight sides of core region 22 (i.e., radius $R_{FP1}$). In this corner location 25C, the distance of outer edge $32E_o$ from field oxide edge 33E increases from a minimum at points $P_0$ and $P_3$ to a maximum at the point farthest into corner location 25C from the straight sides of core region 22, which in this symmetric case is the midpoint between points $P_0$ and $P_3$. The maximum increase in distance between outer edge 32E and constant radius $R_{FP1}$ is illustrated in FIG. 3c as distance $\Delta 32E_{max}$.

FIG. 3d also illustrates similar comparisons for outer edge $34E_o$ of metal field plate 34, inner edge 36E of high voltage conductor 36, and inner edge 38E of active region 38, each of which substantially follow a cubic Bézier curve with a scaling factor s greater than the circular value $$4\frac{(\sqrt{2}-1)}{3}.$$

The shape and placement of these edges $34E_o$, 36E, 38E in corner location 25C begin at their distance from the sides of core region 22, but increase in distance from core region 22 away from those straight sides. The constant radius paths corresponding to the placement of these edges $34E_o$, 36E, 38E are shown for comparison in FIG. 3c as constant radii $R_{FP2}$, $R_{HV1}$, $R_{HV2}$, respectively. In this symmetric example, each of edges $34E_o$, 36E, 38E reach their respective maximum increased distances $\Delta 34E_{max}$, $\Delta 36E_{max}$, $\Delta 38E_{max}$ relative to constant radii $R_{FP2}$, $R_{HV1}$, $R_{HV2}$ at the point along those edges farthest into corner location 25C from the straight sides of core region 22.

Other termination structures in termination region 25 may similarly be shaped according to this embodiment. For example, referring to FIG. 3c, the edges of thick oxide 37 may also be stretched substantially along a $2^{nd}$-order smooth non-circular path in corner locations 25C. Such placement will have some effect on the electric field in termination region 25, considering that thick oxide 37 is a factor in the distance between metal field plate 34 and the underlying semiconductor of epitaxial layer 42.

Figure 3E:
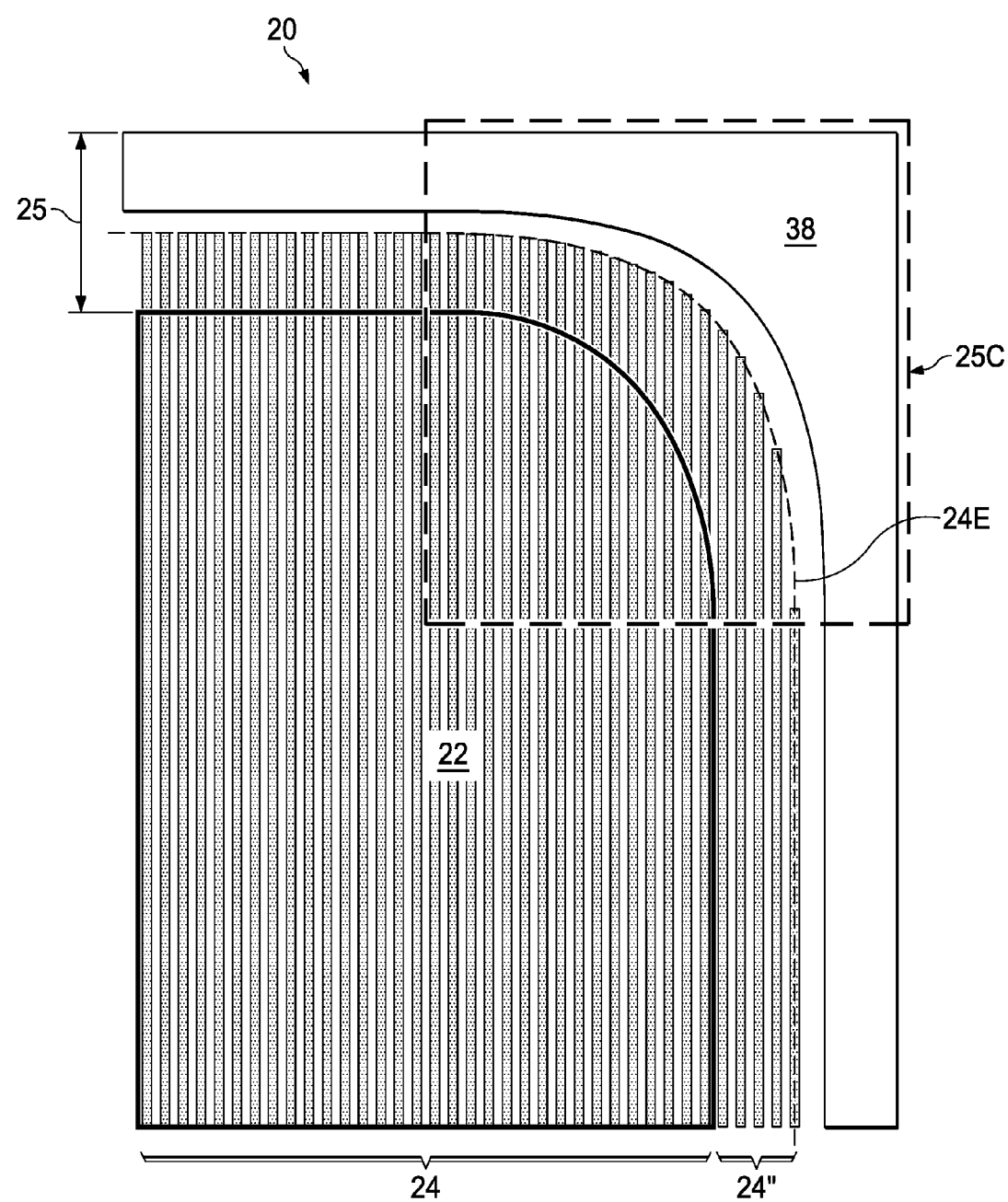
FIG. 3e is a plan view of a corner portion of an integrated circuit including a VDMOS transistor constructed according to an embodiment.

FIG. 3e illustrates another type of termination structure that has an edge stretched into termination region corner location 25C according to this embodiment. In this example, the ends of p-type pillars 24, 24" within corner location 25C define an path or "edge" 24E that is stretched into the corner substantially according to a cubic Bézier curve, more specifically according to an asymmetrical cubic Bézier curve with differing scaling factors s1, s2 as described above relative to FIG. 4b. Edge 24E can be considered to run parallel with sides of core region 22 outside of corner location 25C, for example by running parallel with the outermost pillar 24" along those sides of core region 22, or along the endpoints of pillars 24 extending into termination region 25 along the other sides of core region 22, as shown in FIG. 3e. Other termination structures, such as field plates, high-voltage conductors and regions, insulator films, and the like may also have edges stretched into the corner of termination region 25 within corner location 25C, but are not shown in FIG. 3e for clarity. The doped regions constituted by p-type pillars 24, 24" within termination region 25 will also affect the electric field between core region 22 and the high voltage elements toward the edge of the die, and that therefore the stretching of "edge" 24E defined by the endpoints of those pillars 24, 24" into the corner also can control that electric field so as to improve the breakdown characteristics of VDMOS 20 in this implementation.

As mentioned above and as known in the art, solutions to the electrostatic Poisson's equation indicate that the strength of an electric field is enhanced at sharp geometric corners (i.e., smaller local radius of curvature) of the relevant conductors. For example, referring to the embodiment shown in FIGS. 3a and 3d, the local radius of curvature of each of edges $32E_o$, $34E_o$, 36E, 38E decreases at points farther into corner location 25C from the straight sides of core region 22, and will in fact be at a minimum at the points at which these edges reach their respective maximum increased distances $\Delta 34E_{max}$, $\Delta 36E_{max}$, $\Delta 38E_{max}$ relative to constant radii $R_{FP2}$, $R_{HV1}$, $R_{HV2}$, respectively, and will have higher curvature (i.e., a smaller radius of curvature) than the circular paths of those constant radii $R_{FP2}$, $R_{HV1}$, $R_{HV2}$, respectively. As such, the electric field at points along those edges will be at a maximum at those points of minimum local radius of curvature. But because these termination structure edges $32E_o$, $34E_o$, 36E, 38E are stretched toward the corner of the die, the potential difference between the edge of the die and core region 22 is being dropped over a longer overall distance within termination region 25, as compared with the conventional layout in which the termination structure edges follow a circular path in the corners. Accordingly, even though the electric field is enhanced at those points of minimum local radius of curvature, the magnitude of the field is lower than at corresponding edges along a circular path in the corners. As a result, the stretching of the termination structure edges in corner locations 25C substantially along a $2^{nd}$-order smooth, non-circular curve, such as a cubic Bézier curve, facilitates the optimization of the shape and magnitude of the lateral off-state electric field within termination region 25.

According to this embodiment, the stretching of the shape and placement of termination structure edges can thus significantly improve the ability of termination region 25 to laterally support the off-state drain-to-source voltage of power VDMOS 20. This improvement, and the usage of otherwise wasted chip area in the corners of the integrated circuit die in which VDMOS 20 is realized, can result in improved efficiency from the standpoint of current delivered per unit area of power VDMOS 20.

Various alternatives and variations to this embodiment are contemplated. According to one such alternative, the reduced and controlled electric field provided by this stretching of termination structure edges toward the die corner can enable termination region 25 to be placed closer to the active elements of core region 22, for example by moving field oxide 33 further toward the center of core region 22, which reduces or even can eliminate the need for transition region 23 and its non-active pillars 24'. This placement of field oxide edge 33E would additionally lengthen the distance over which potential is dropped between core region 22 and high-voltage active region 38, and thus lower the strength of the electric field in termination region 25.

According to another alternative, the stretching of termination structure edges toward the die corner can allow moving the boundary of core region 22 (i.e., field oxide edge 33E in the embodiment of FIGS. 3a through 3c) farther into the corner of the die. For example, field oxide edge 33E may also be shaped and placed substantially according to a $2^{nd}$-order smooth, non-circular path so as to increase the size of core region 22 and thus the drive current of the device, while keeping the overall integrated circuit device size constant.

Other alternatives and variations include the stretching of termination structure edges in this manner in power devices such as vertical MOSFETs of the non-superjunction type, IGBTs, vertical power diodes, and the like. It is contemplated that such alternatives and variations that will be apparent to those skilled in the art having reference to this specification are within the scope of this invention as hereinafter claimed.

The alternating n-type and p-type doped columns extending from the surface of superjunction power MOSFET devices necessarily present the possibility of parasitic thyristor or SCR devices. In those devices that include a termination region with non-active p-type pillars, such as described above relative to FIGS. 3b and 3c, these non-active pillars are either floating, in that they are not hard-wired to the source potential or otherwise physically connected to a normally biased node of the device, or in the case of non-active portions of pillars, they are weakly electrically connected to source potential through the active portion of the p-type pillar itself; however, these weakly connected non-active portions of the pillars are subject to being electrically disconnected from the active portion of the pillar as the drain potential is increased causing the weakly connected portions of the pillars to become increasingly depleted of free carriers. As a result, these non-active floating or weakly connected doped regions are susceptible to local biasing from adjacent pillars, including from the active core region of the device. Should this local biasing becomes sufficiently large to trigger the parasitic n-p-n-p SCR device structure, high leakage current and device breakdown will occur at a much lower voltage than would otherwise be expected based on the superjunction depth and the termination region design.

According to another embodiment, the termination region of a vertical superjunction semiconductor device is constructed to inhibit parasitic leakage and triggering of the parasitic SCR structure inherent in that type of device, by one or more electrically floating doped regions located near the outer edge of the termination region of that device and that surround the doped regions that constitute the parasitic SCR structure. These floating doped regions, or guard rings, will appear in two dimensions as one or more concentric rings when viewed from above the surface of the device, as will now be described.

Figure 5A:
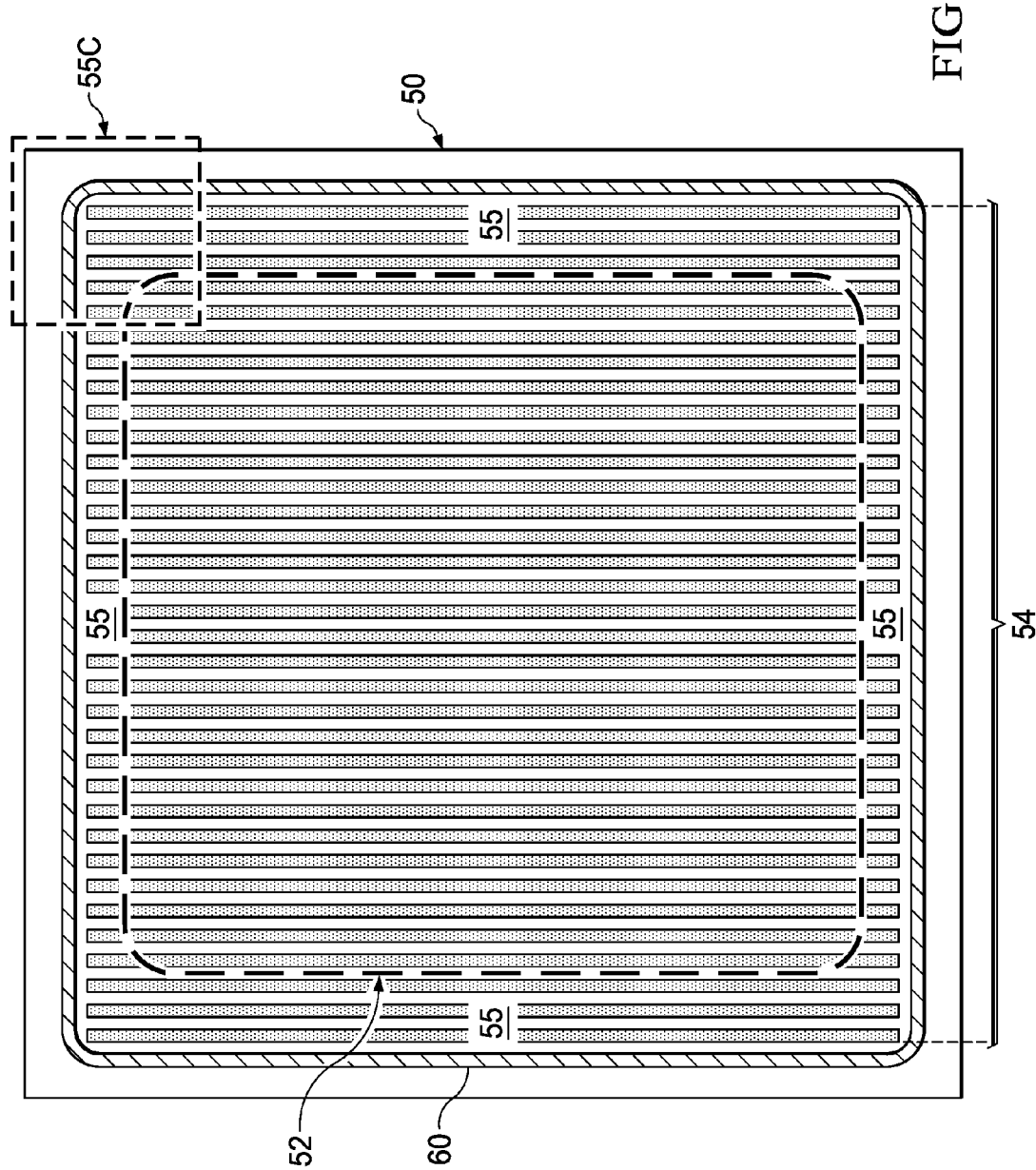
FIGS. 5a through 5d are plan views of the layout of a VDMOS transistor constructed according to certain embodiments.

FIG. 5a illustrates VDMOS transistor 50, for example an n-channel VDMOS transistor formed in an n-type silicon substrate with an overlying n-type epitaxial layer. Of course, VDMOS 50 may alternatively be formed as a p-channel VDMOS transistor, in which case the conductivity type of its various elements will be opposite to that of this description. In similar fashion as described above for the embodiment shown in FIG. 2a, p-type pillars 54 in the form of parallel stripes extend across the interior of the integrated circuit die in which VDMOS 50 is realized, extending into the n-type epitaxial layer as described above so that n-type epitaxial silicon will be present between adjacent p-type pillars 54 in the view of FIG. 5a. And as described above, p-type pillars 54 and the other corresponding elements of VDMOS 50 may alternatively be arranged as an array of "cells".

Core region 52 demarked in FIG. 5a indicates the portion of the integrated circuit die at which p-type body regions, n+ source regions, and contacts are formed within those pillars 54, and will be biased to a ground voltage ($V_{ss}$) in this n-channel implementation. As before, the boundary of core region 52 shown in FIG. 5a corresponds to the location of an inner edge of an isolation dielectric film, such as field oxide 33 in the embodiment of FIGS. 3b and 3c. Similarly as described above, termination region 55 shown in FIG. 5a is that portion of the die outside of core region 52. Structures such as those described above in connection with FIGS. 3a through 3d may be provided within this termination region 55 to laterally support the drain-to-source voltage applied to VDMOS 50 in the off-state. In this regard, those portions of pillars 54 outside of core region 52, as well as those pillars 54 that are entirely outside of core region 52, will not be actively biased at the source voltage in the off-state, as noted above, but will affect the electric field in termination region 55 as discussed above.

In this embodiment shown in FIG. 5a, electrically floating guard ring 60 is disposed within termination region 55 and surrounding parallel p-type pillars 54 of VDMOS 50. In this n-channel vertical MOSFET implementation, guard ring 60 is a contiguous p-type doped region formed into the n-type epitaxial layer. As will be described in further detail below, guard ring 60 may be formed simultaneously as one or more of the last segments of p-type pillars 54 formed during the epitaxy of the n-type silicon, in which case guard ring 60 will have the same depth, width, and dopant concentration as those segments and will form a three-dimensional wall of doped material (p-type in this example). In some implementations, guard ring 60 may extend to the full depth of p-type pillars 54. Alternatively, the depth, formation, and dopant concentration of guard ring 60 may differ from p-type pillars 54, for example as formed by masked ion implantation into the n-type epitaxial layer, prior to the formation of field oxide, to have a depth partially that of the top-most superjunction pillar segment. For example, guard ring 60 may have a typical depth in a range from on the order of about 10 μm to about 100 μm for vertical superjunction MOSFET implementations according to current-day technology.

Figure 5B:
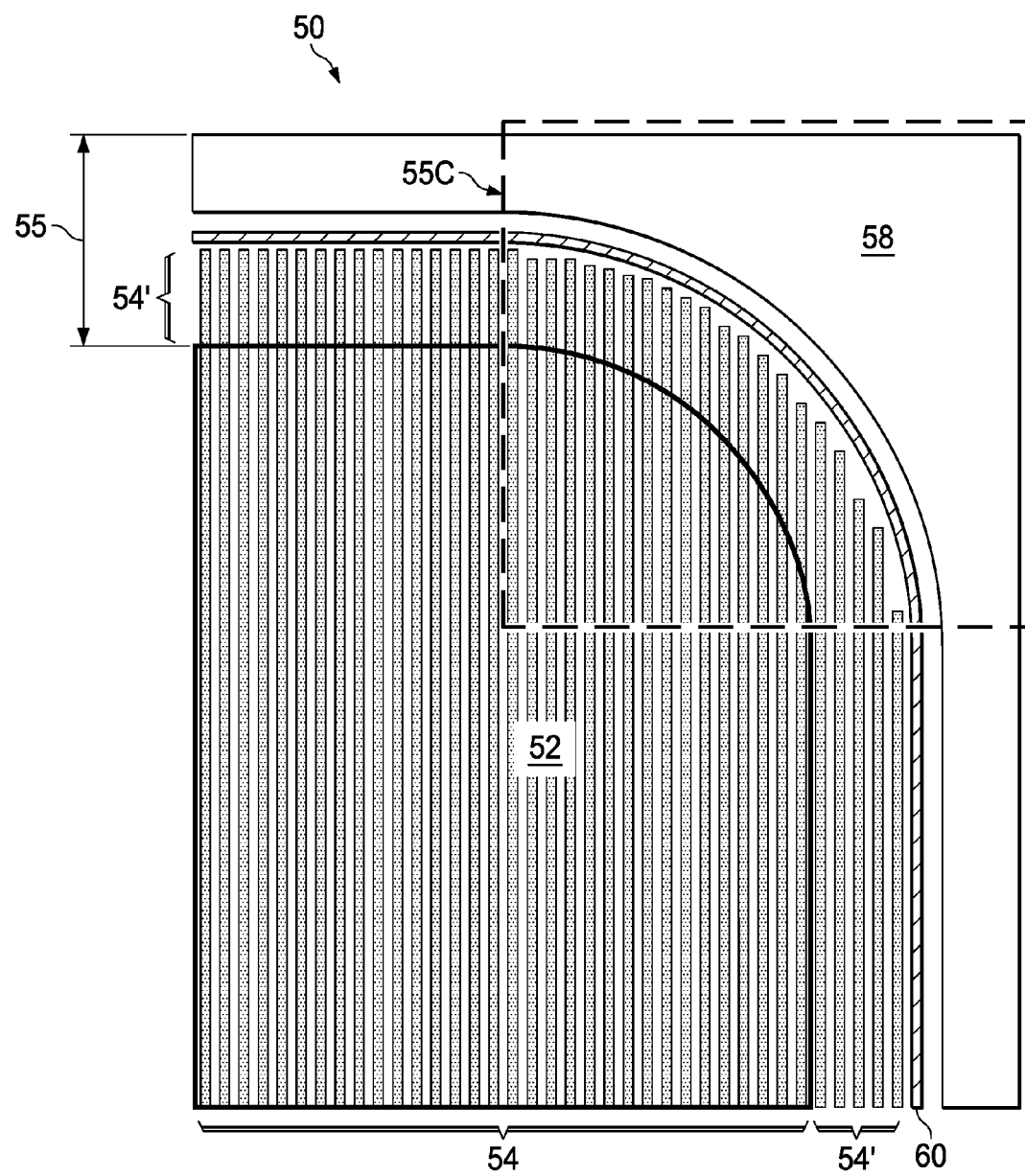

FIG. 5b illustrates an example of the placement of guard ring 60 in the vicinity of a corner location 55C of VDMOS 50, at a stage of manufacture prior to the formation of field plates within termination region 55. Guard ring 60 surrounds core region 52 and non-active pillars (and non-active portions of pillars) 54' in termination region 55, and is placed inside of active region 58 at the edges of the die. If desired, guard ring 60 may underlie a high-voltage conductor in contact with active region 58. In the view of FIG. 5b, a vertically-running portion of guard ring 60 is parallel with these non-active pillars 54', and is spaced from the outermost non-active pillar 54' by the same spacing as that of adjacent pillars 54, 54' to maintain photolithographic regularity. On other sides of core region 52, a horizontally-running portion of guard ring 60 (in the view of FIG. 5b) is parallel to the ends of non-active pillar portions 54', at about the same spacing. Alternatively, the spacing between guard ring 60 and pillars 54' may be different from that among pillars 54, 54' themselves, such as may be useful in controlling the off-state electric field in termination region 55.

Figure 6A:
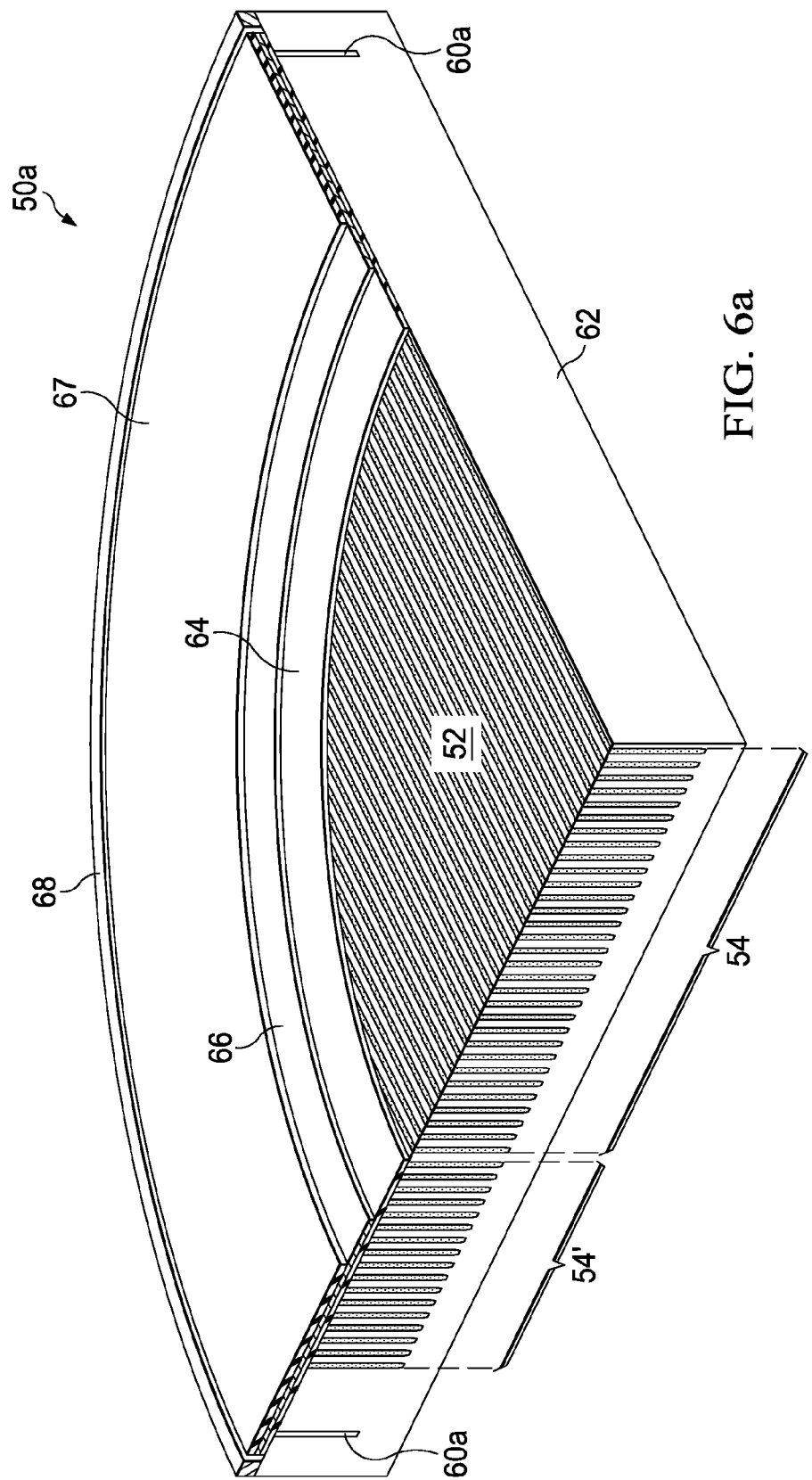
FIGS. 6a and 6b are cutaway views of a portion of an integrated circuit constructed according to the embodiments of FIGS. 5a and 5b.
Figure 6B:
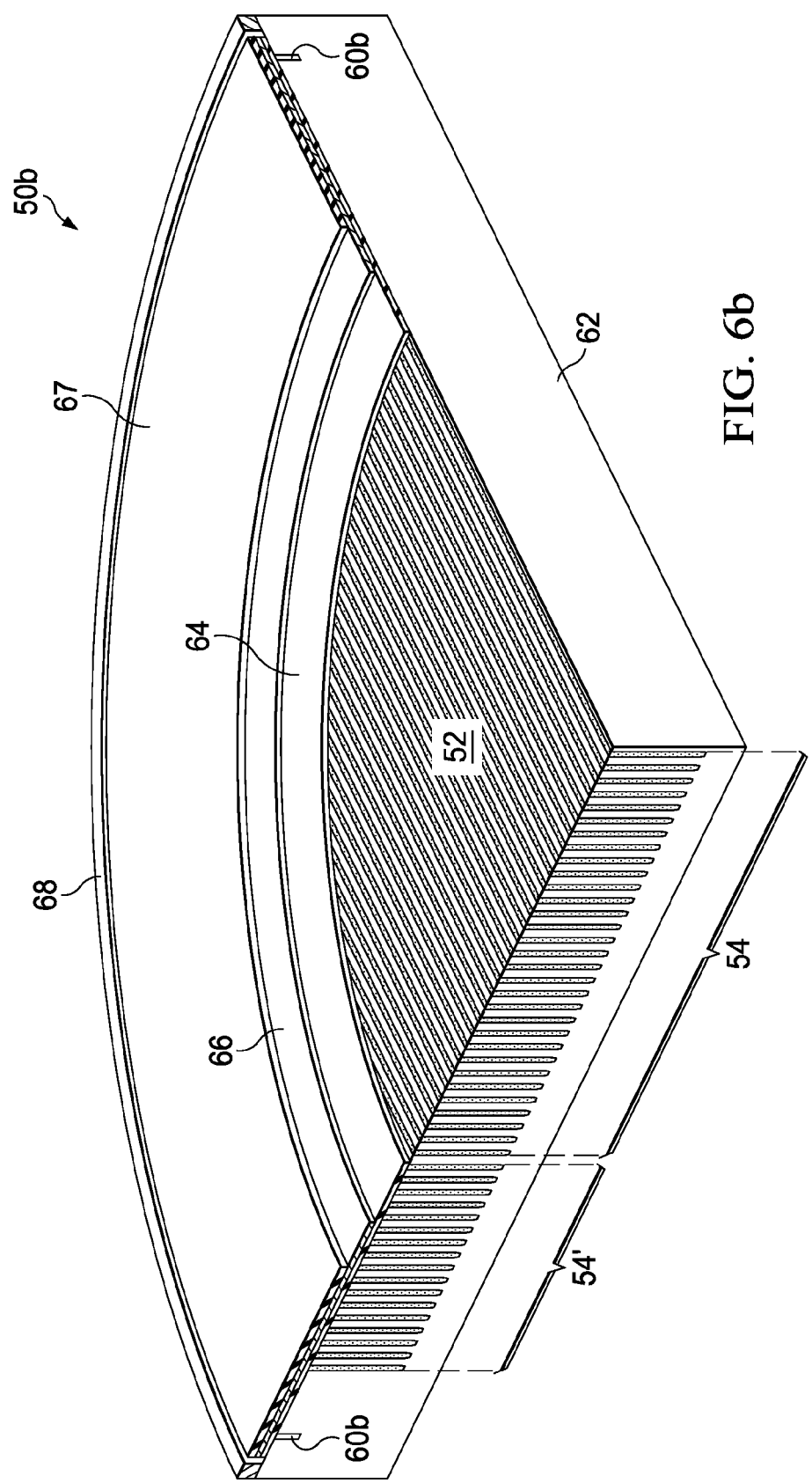

FIGS. 6a and 6b illustrate variations of the depth to which guard ring 60 may extend into n-type epitaxial layer 62 of VDMOS 50. The cutaway view of VDMOS 50a shown in FIG. 6a illustrates certain termination structures similar to those described above in connection with FIGS. 3a through 3c. These termination structures include poly field plate 64, metal field plate 66, thick oxide 67, and high voltage conductor 68. VDMOS 50a of FIG. 6a is of the superjunction type, and as such p-type pillars 54, 54' are formed to a depth extending quite deep into n-type epitaxial layer 62, for example as formed by multiple implants after each step of a multiple step epitaxial process forming layer 62. In this example, p-type guard ring 60a has a similar depth as that of pillars 54, 54', and as such may be formed in the same manner as pillars 54, 54' during the epitaxy of n-type layer 62. In the example of VDMOS 50*a* shown in FIG. 6*a*, guard ring 60*a* is spaced farther from the outermost non-active body region 54' than the spacing between adjacent body regions 54, 54'.

FIG. 6*b* illustrates the construction of superjunction VDMOS 50*b*, in which p-type guard ring 60*b* has a much shallower depth than superjunction pillars 54, 54'. In this implementation, guard ring 60*b* is formed by a masked ion implantation after n-type epitaxial layer 62 has been completely formed, and prior to the deposition or thermal growth of field oxide in termination region 55. Alternatively, guard ring 60*b* may partially extend into epitaxial layer 62, for example as implanted along with the top-most one or more segments of superjunction pillars 54, 54'.

According to this embodiment, guard-ring 60*a*, 60*b* is not actively biased in the off-state of VDMOS 50, but rather is left electrically floating. This is in contrast to conventional guard ring structures for vertical power devices, which are typically biased to ground (e.g., the source voltage). According to this invention, the electrically floating guard ring structure shields the multi-layer bipolar structure of the interleaved p-type pillars and n-type epitaxial silicon in the termination region from the injection of stray carriers from the equipotential ring or "equalization ring" at the edge of the structure, such as from active region 58 in the view of FIG. 5*b*, that is at the same potential as the applied drain voltage at the substrate of VDMOS 50. It is those stray carriers, absent such shielding, that can trigger the parasitic SCR created by the alternating p-type and n-type regions, and thus cause significant off-state leakage and breakdown in power switching devices such as power MOSFETs.

In addition, the electrically floating guard ring structure of this embodiment can be efficiently implemented in modern power devices. In particular, the implementation of one or more floating doped guard rings into the termination region does not necessitate the adding of additional width to the termination region to accommodate those regions. This is because the addition of these floating guard rings is not contemplated to interfere with the electric field distribution in the termination region, considering that the guard rings may be added near the outer edge of the termination region, where the electric field is typically much lower than the critical field and thus at which the alternating n-type and p-type column regions will not yet be depleted of charge at the onset of the off-state. As described above relative to VDMOS 50, guard ring 60 may be formed in the same processes as body regions 54 of VDMOS 50, and as such the addition of floating guard rings according to this embodiment will not add additional photolithography steps to the manufacturing process, and thus will not increase wafer processing cost.

In the embodiment described above in connection with FIGS. 5*a*, 5*b*, and 6*a* and 6*b*, VDMOS 50 is constructed with termination structures (e.g., active region 58; field plates 64, 66; high voltage conductor 68) having edges that follow circular paths in corner location 55C. Alternatively, the electrically floating guard rings according to this embodiment may also be considered as termination structures, with edges stretched into corner locations 55C substantially along non-circular $2^{nd}$-order smooth paths, as will now be described with reference to FIGS. 5*c* and 5*d*.

Figure 5C:
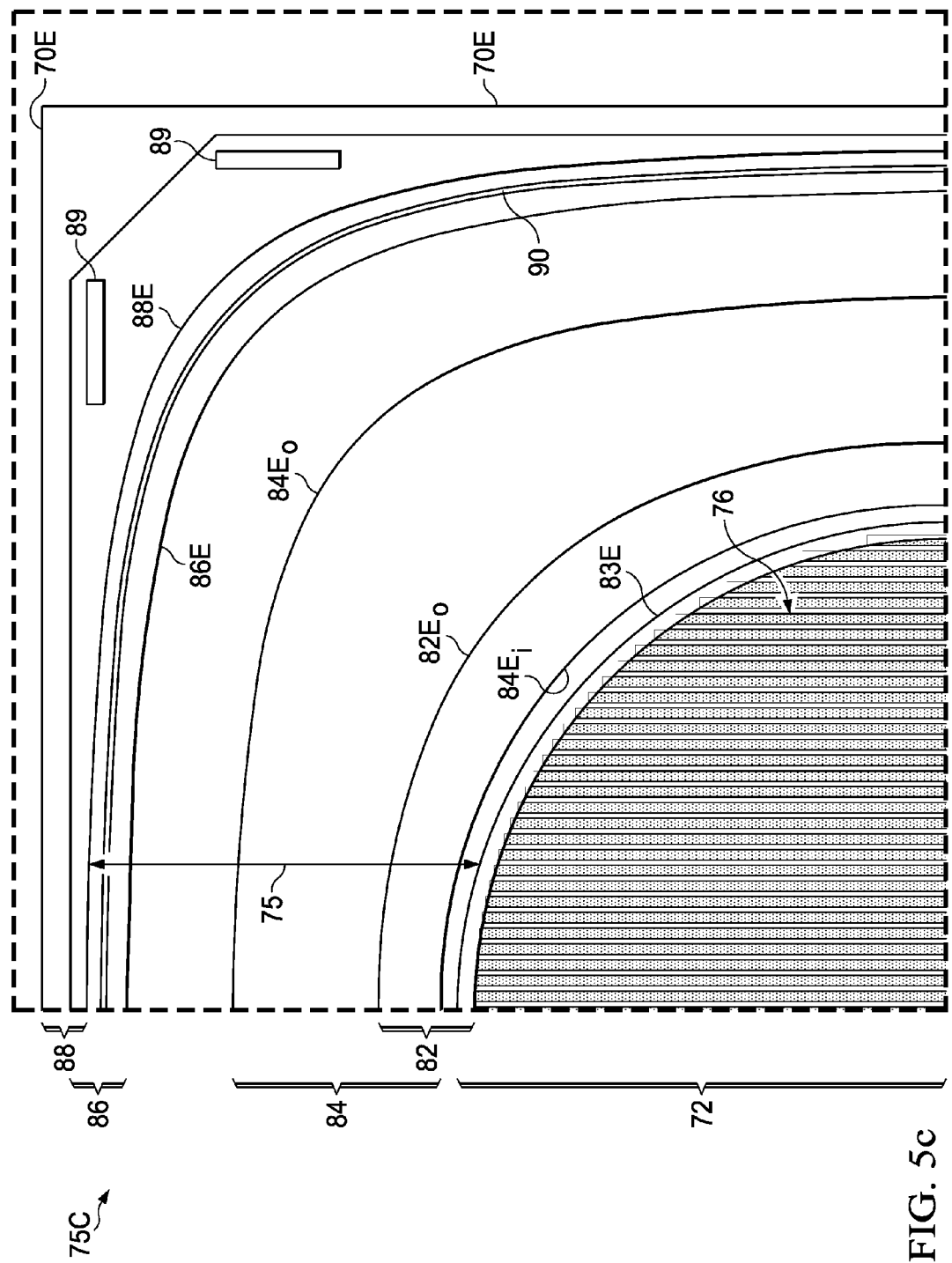

FIG. 5*c* illustrates a corner location of a die in which an n-channel power MOSFET is implemented, as indicated by edges 70E of that die along two sides of the view of FIG. 5*c*. The construction shown in FIG. 5*c* is similar to that described above relative to FIG. 3*a*. Core region 72 includes the portion of the power MOSFET through which on-state source/drain current will flow and thus at which the body and source regions are formed and connected to one another at contact locations 76. As before, core region 72 extends to inner edge 83E of a relatively thick insulator layer, such as field oxide; termination region 75 thus refers to the portion of the die outside of core region 72, beginning with that inner field oxide edge 83E. Polysilicon field plate 82 runs contiguously on all sides and around all corners of core region 72, with its inner portion extending into core region 72 and its outer edge 82E$_o$ within termination region 75. Metal field plate 84 in termination region 75 also extends contiguously on all sides and around all corners of core region 72, with its inner edge 84E$_i$ overlying poly field plate 82 and its outer edge 84E$_o$ overlying thick oxide within termination region 75 as discussed above. Active region 88 is at the surface of the n-type epitaxial layer overlying the substrate and is contacted by high-voltage metal conductor 86 at contacts 89 as shown. High-voltage conductor 86 extends contiguously on all sides and around all corners around core region 72 and much of termination region 75, near the outer perimeter of the die, and has an inner edge 86E as shown.

In this embodiment, as described above relative to FIGS. 3*a* through 3*d*, various edges of termination structures in termination region 75 are shaped and placed in corner location 75C according to at least an approximation of a conformally mapped solution, so as to avoid introducing undesirable kinks in the lateral electric field between active region 88 near die edges 70E, which is at the applied drain voltage for the case of a power MOSFET, and core region 76, which is at the source voltage and which is fully depleted in the off-state of the device. As described above, these termination structure edges can be shaped and placed according to a conformal map solution that stretches or bends the termination structure edges into corner locations 75C of termination region 75, in an ideal implementation. Alternatively, the edges of these termination structures can be stretched into corner location 75C substantially according to a $2^{nd}$-order smooth, non-circular analytic function such as a third or higher order Bézier curve. In the implementation shown in FIGS. 5*c* and 5*d*, edges 82E$_o$, 84E$_i$, 84E$_o$, 86E, and 88E substantially follow a cubic Bézier curve with a scaling factor s greater than the circular value, e.g., $$s > 4\frac{(\sqrt{2}-1)}{3}.$$

According to this embodiment, as shown in FIG. 5*c*, a single electrically floating p-type doped guard ring 90 is provided. As described above relative to FIGS. 5*a* and 5*b*, guard ring 90 encircles core region 72 with its p-type pillars, as well as non-active p-type pillars that lie outside of core region 72 in termination region 75. In this superjunction implementation, guard ring 90 may extend to the full depth of the pillars within core region 72 and termination region 75, or only to a partial depth relative to those body regions, as described above. Guard ring 90 may be spaced from the nearest non-active pillars by the same spacing as adjacent pillars for photolithographic regularity, or alternatively by a wider spacing if desired for control of the electric field. In the example of FIG. 5*c*, guard ring 90 is disposed adjacent to high-voltage active region 88 and underlying high-voltage conductor 86. Within corner location 75C, electrically isolated guard ring 90 substantially follows a cubic Bézier curve with a scaling factor s greater than the circular value $$\left(e.g., s > 4\frac{(\sqrt{2}-1)}{3}\right),$$

and is thus stretched toward the die corner in a similar fashion as the other termination structure edges of that structure. Of course, guard ring 90 will also have straight sides that run parallel with and along the straight sides of core region 72.

Figure 5D:
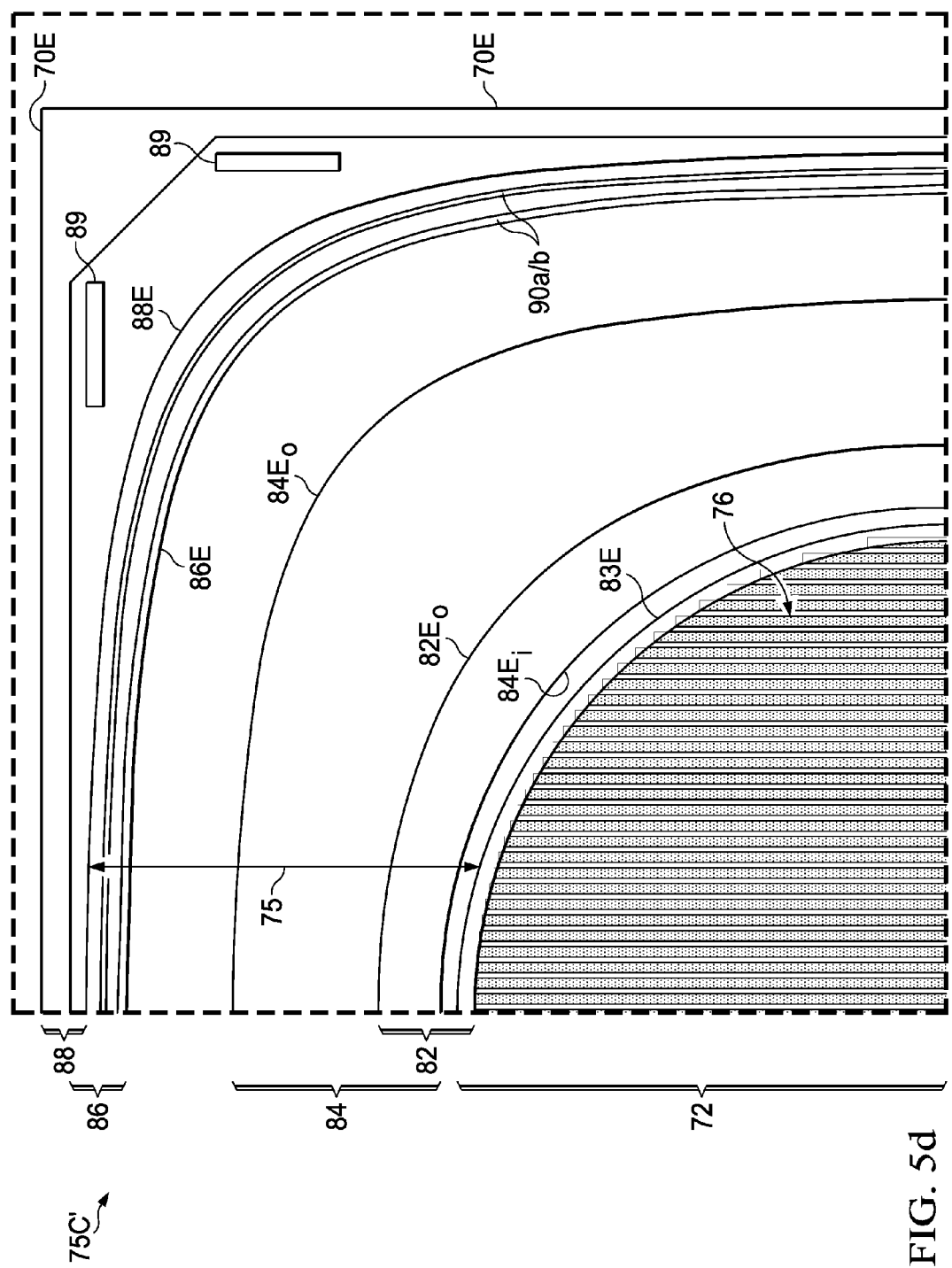

FIG. 5d illustrates another implementation of this embodiment relative to corner location 75C' of an n-channel VDMOS transistor. The arrangement of corner location 75C' and the various termination structures within termination region 75 in this implementation correspond to those described above relative to FIG. 5c. In the implementation of FIG. 5d, however, two electrically isolated p-type guard rings 90a, 90b are provided, each encircling core region 72 and also any non-active p-type pillar regions (not shown) that lie outside of core region 72. The spacing between guard rings 90a, 90b may correspond to the spacing between adjacent p-type pillar regions within core region 72 and termination region 75 for photolithographic regularity, or alternatively may differ from that spacing such as to control the off-state electric field. As in the implementation of FIG. 5c, electrically isolated guard rings 90a, 90b of FIG. 5d each substantially follow a cubic Bézier curve with a scaling factor s greater than the circular value so that each is stretched toward the die corner. Each guard ring 90a, 90b will also have straight sides running parallel with the straight sides of core region 72.

The embodiments described above relative to FIGS. 5c and 5d thus attain the advantages of improved breakdown performance and more efficient use of the chip area that are provided by the stretched corners of the termination structures, as well as the reduced vulnerability to triggering of parasitic p-n-p-n structures and thus improved breakdown performance provided by the electrically isolated guard rings in the resulting structure, with no additional chip area required and no additional complexity added to the manufacturing process flow.

As mentioned above, while these embodiments are described in connection with n-channel VDMOS devices, similar advantages can be attained by implementing these embodiments in other types of power switching devices, including without limitation superjunction and non-superjunction trench gate VDMOS transistors, p-channel VDMOS devices of various types, IGBTs, and vertical power diodes. Those skilled in the art having reference to this specification will be readily able to adapt these embodiments to those alternative types of power switching without undue experimentation.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit comprising:
    a semiconductor substrate of a first conductivity type;
    an epitaxial layer of the first conductivity type overlying the substrate, the epitaxial layer having a lighter dopant concentration than the substrate;
    a core region disposed into a surface of the epitaxial layer, the core region including an array of vertical transistor structures with terminal nodes electrically connected in parallel, the substrate serving as one of the terminal nodes of the vertical transistor structures, the core region having a plurality of sides aligned in parallel with edges of the integrated circuit;
    a termination region surrounding the core region; and
    a first termination structure having a portion overlying a portion of the termination region and disposed at or near a surface of the termination region;
    wherein a first edge of the first termination structure has at least one substantially linear portion parallel to a side of the core region, and at least one curved corner portion substantially following a second-order smooth curve with varying local radii of curvature.

2. The integrated circuit of claim 1, wherein the first termination structure comprises:
    a first field plate having a portion overlying a portion of the termination region and disposed at or near the surface of the termination region, the first field plate comprising a continuous conductive element surrounding the core region;
    and wherein the first edge of the first termination structure corresponds to an outer edge of the first field plate.

3. The integrated circuit of claim 2, wherein the first field plate has an inner edge with at least one substantially linear portion parallel to a side of the core region and at least one curved corner portion substantially following a second-order smooth curve with varying local radii of curvature.

4. The integrated circuit of claim 2, further comprising:
    a second field plate having a portion overlying a portion of the first field plate, and comprising a continuous conductive element surrounding the core region;
    wherein an outer edge of the second field plate has at least one substantially linear portion parallel to a side of the core region, and at least one curved corner portion substantially following a second-order smooth curve with varying local radii of curvature.

5. The integrated circuit of claim 4, wherein the first field plate is comprised of polysilicon and the second field plate is comprised of a metal.

6. The integrated circuit of claim 4, wherein the outer edge of the second field plate is disposed farther from the core region than the outer edge of the first field plate.

7. The integrated circuit of claim 1, wherein the at least one curved corner portion of the first edge of the first termination structure substantially follows a third or higher order Bézier curve.

8. The integrated circuit of claim 1, wherein a perimeter active region of the epitaxial layer extends to the surface near the edges of the integrated circuit, surrounding the core region;
    and wherein the at least one curved corner portion of the first edge of the first termination structure substantially follows a conformally mapped solution of the electric field between the perimeter active region and the core region.

9. The integrated circuit of claim 1, wherein a perimeter active region of the epitaxial layer extends to the surface near the edges of the integrated circuit, surrounding the core region, the perimeter active region having an inner edge;
    and further comprising:

a perimeter conductor element disposed near the surface in electrical contact with the perimeter active region and having a portion overlying at least a portion of the perimeter active region, the perimeter conductor element having an inner edge surrounding the core region;

wherein the inner edge of the perimeter conductor element has at least one curved corner portion substantially following a second-order smooth curve with varying local radii of curvature.

10. The integrated circuit of claim 9, further comprising:
a thick oxide layer disposed near the surface and having a portion underlying the perimeter conductor element;
and wherein the first edge of the first termination structure corresponds to an edge of the thick oxide layer.

11. The integrated circuit of claim 1, wherein the vertical transistor structures are vertical metal-oxide-semiconductor field-effect-transistors, each comprising a body region of a second conductivity type formed at the surface of the epitaxial layer, a source region of the first conductivity type disposed at the surface of the body region, a drain region in the epitaxial layer, and a gate electrode disposed near a portion of the body region between the source region and the drain region;
wherein the source regions of the vertical transistor structures are connected in common;
wherein the gate electrodes of the vertical transistor structures are connected in common;
and wherein the substrate serves as a common drain of the vertical transistor structures.

12. The integrated circuit of claim 11, wherein each of the vertical transistor structures comprise:
a doped pillar of the second conductivity type formed into the epitaxial layer at a location underlying and in contact with the body region.

13. The integrated circuit of claim 12, further comprising:
non-active pillars of the second conductivity type formed into the epitaxial layer and disposed at least in part in the termination region;
wherein the doped pillars and non-active pillars extend along the surface in stripes parallel to one another;
wherein the first termination structure comprises portions of the doped and non-active pillars within the termination region;
and wherein the first edge of the first termination structure corresponds to endpoints of the doped and non-active pillars within the termination region.

14. The integrated circuit of claim 1, wherein the core region has an outer boundary that substantially follows a second-order smooth curve with varying local radii of curvature at its corner locations between its adjacent sides.

15. The integrated circuit of claim 1, wherein a local radius of curvature of the at least one curved corner portion of the first edge is at a minimum at a point farthest from the core region.

16. The integrated circuit of claim 1, wherein a perimeter active region of the epitaxial layer extends to the surface near the edges of the integrated circuit, surrounding the core region;
and further comprising:
a first electrically floating continuous guard ring surrounding a portion of the termination region, and comprising a doped region of the second conductivity type formed into a surface of the epitaxial layer between the core region and the perimeter active region.

17. The integrated circuit of claim 16, wherein the vertical transistor structures are vertical superjunction metal-oxide-semiconductor field-effect-transistors, each comprising a pillar region of the second conductivity type extending into the epitaxial layer to a depth, a body region of a second conductivity type formed at the surface of the epitaxial layer, a source region of the first conductivity type disposed at the surface of the body region, a drain region in the epitaxial layer, and a gate electrode disposed near a portion of the body region between the source region and the drain region;
wherein the source regions of the vertical transistor structures are connected in common;
wherein the gate electrodes of the vertical transistor structures are connected in common;
wherein the substrate serves as a common drain of the vertical transistor structures;
and wherein the first guard ring extends to a depth of substantially the depth of the pillar region.

18. The integrated circuit of claim 16, wherein the vertical transistor structures are vertical superjunction metal-oxide-semiconductor field-effect-transistors, each comprising a pillar region of the second conductivity type extending into the epitaxial layer to a depth, a body region of a second conductivity type formed at the surface of the epitaxial layer, a source region of the first conductivity type disposed at the surface of the body region, a drain region in the epitaxial layer, and a gate electrode disposed near a portion of the body region between the source region and the drain region;
wherein the source regions of the vertical transistor structures are connected in common;
wherein the gate electrodes of the vertical transistor structures are connected in common;
wherein the substrate serves as a common drain of the vertical transistor structures;
and wherein the first guard ring extends to a depth less than the depth of the pillar region.

19. The integrated circuit of claim 16, further comprising:
a second electrically floating continuous guard ring surrounding a portion of the termination region, and comprising a doped region of the second conductivity type formed into a surface of the epitaxial layer between the first guard ring and the perimeter active region.

20. The integrated circuit of claim 19, wherein the vertical transistor structures are vertical superjunction metal-oxide-semiconductor field-effect-transistors, each comprising a pillar region of the second conductivity type extending into the epitaxial layer to a depth, a body region of a second conductivity type formed at the surface of the epitaxial layer, a source region of the first conductivity type disposed at the surface of the body region, a drain region in the epitaxial layer, and a gate electrode disposed near a portion of the body region between the source region and the drain region;
wherein the source regions of the vertical transistor structures are connected in common;
wherein the gate electrodes of the vertical transistor structures are connected in common;
wherein the substrate serves as a common drain of the vertical transistor structures;
and wherein at least one of the first and second guard rings extends to a depth of substantially the depth of the pillar region.

21. The integrated circuit of claim 19, wherein the vertical transistor structures are vertical superjunction metal-oxide-semiconductor field-effect-transistors, each comprising a pillar region of the second conductivity type extending into the epitaxial layer to a depth, a body region of a second conductivity type formed at the surface of the epitaxial layer, a source region of the first conductivity type disposed at the surface of the body region, a drain region in the epitaxial layer, and a gate electrode disposed near a portion of the body region between the source region and the drain region;
  wherein the source regions of the vertical transistor structures are connected in common;
  wherein the gate electrodes of the vertical transistor structures are connected in common;
  wherein the substrate serves as a common drain of the vertical transistor structures;
  and wherein at least one of the first and second guard rings extends to a depth less than the depth of the pillar region.

22. An integrated circuit comprising:
  a semiconductor substrate of a first conductivity type;
  a core region disposed into a surface of the substrate, the core region including an array of vertical power device structures with terminal nodes electrically connected in parallel, the backside of the substrate serving as one of the terminal nodes of the vertical power device structures, the core region having a plurality of sides aligned in parallel with edges of the integrated circuit;
  a termination region surrounding the core region; and
  a first termination structure having a portion overlying a portion of the termination region and disposed at or near the surface of the termination region;
  wherein a first edge of the first termination structure has at least one substantially linear portion parallel to a side of the core region, and at least one curved corner portion substantially following a second-order smooth curve with varying local radii of curvature.

23. The integrated circuit of claim 22, wherein the first termination structure comprises:
  a first field plate having a portion overlying a portion of the termination region and disposed at or near the surface of the termination region, the first field plate comprising a continuous conductive element surrounding the core region;
  and wherein the first edge of the first termination structure corresponds to an outer edge of the first field plate.

24. The integrated circuit of claim 23, further comprising:
  a second field plate having a portion overlying a portion of the first field plate, and comprising a continuous conductive element surrounding the core region;
  wherein the outer edge of the second field plate has at least one substantially linear portion parallel to a side of the core region, and at least one curved corner portion substantially following a second-order smooth curve with varying local radii of curvature.

25. The integrated circuit of claim 22, wherein the backside of the substrate is doped with a dopant of a second conductivity type.

26. The integrated circuit of claim 22, wherein the backside of the substrate is further doped with a dopant of the first conductivity type.

* * * * *